United States Patent
Brown et al.

(10) Patent No.: US 7,340,012 B2
(45) Date of Patent: *Mar. 4, 2008

(54) SINGLE AND MULTIPLE SINEWAVE MODULATION AND DEMODULATION TECHNIQUES EMPLOYING CARRIER-ZERO AND CARRIER-PEAK DATA-WORD START AND STOP

(75) Inventors: Forrest J. Brown, Carson City, NV (US); Ronald E. Kunzel, Carson City, NV (US); David W. Loar, Reno, NV (US); Kenneth D'Alessandro, Glenbrook, NV (US)

(73) Assignee: Data Flow Technologies, Inc., Carson City, NV (US)

( * ) Notice: Subject to any disclaimer, the term of this patent is extended or adjusted under 35 U.S.C. 154(b) by 259 days.

This patent is subject to a terminal disclaimer.

(21) Appl. No.: 11/071,865

(22) Filed: Mar. 2, 2005

(65) Prior Publication Data

US 2006/0198468 A1 Sep. 7, 2006
US 2007/0274415 A9 Nov. 29, 2007

Related U.S. Application Data

(63) Continuation-in-part of application No. 10/825,789, filed on Apr. 16, 2004, now Pat. No. 7,046,741.

(51) Int. Cl.
*H04L 27/04* (2006.01)
(52) U.S. Cl. ................ 375/320; 375/268; 375/300
(58) Field of Classification Search ........... 375/259, 375/260, 268, 300, 320; 332/149; 455/108
See application file for complete search history.

(56) References Cited

U.S. PATENT DOCUMENTS

| 6,574,284 B1 | 6/2003 | Jordan .................. 375/268 |
| 6,621,426 B1 | 9/2003 | van Nguyen ............ 341/50 |
| 7,046,741 B2 * | 5/2006 | Brown et al. ............ 375/300 |

OTHER PUBLICATIONS

Harold R. Walker, "Understanding Ultra Narrowband Modulation", *Microwaves & RF*, pp. 53-54, 56, 58, 60-61, Dec. 2003.

* cited by examiner

*Primary Examiner*—David B. Lugo
(74) *Attorney, Agent, or Firm*—Sierra Patent Group, Ltd.

(57) ABSTRACT

A method for detecting encoded digital data from a substantially sinusoidal waveform, the encoded digital data having one of a first value and a second value at selected phase angles $\theta_n$ comprises generating the waveform having an amplitude Y defined by a first function at phase angles lying outside of regions having a range $\Delta\theta$ beginning at each phase angle $\theta_n$, said first function being $Y=\sin\theta$; generating the waveform having an amplitude Y defined by the first function at phase angles lying inside the regions having a range of $\Delta\theta$ beginning at each phase angle $\theta_n$ where data of the first value is to be encoded; and generating the waveform having an amplitude Y defined by a second function at phase angles lying inside the regions having a range of $\Delta\theta$ associated with each phase angle $\theta_n$ where data of the second value is to be encoded, the second function being different from $Y=\sin\theta$, the detection including deriving sync pulses from minima and maxima of the substantially sinusoidal waveform to frame data words.

48 Claims, 18 Drawing Sheets

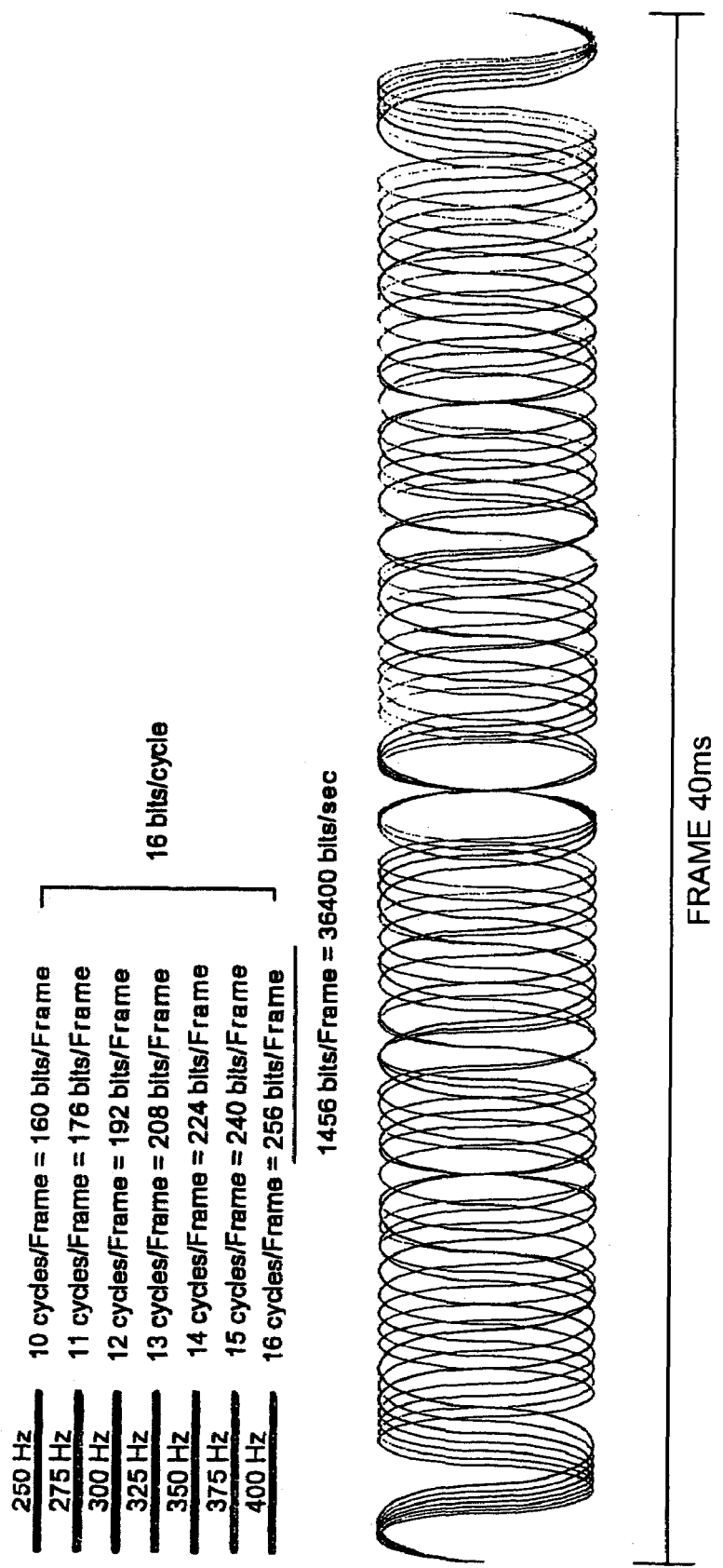

Multi-bit Sinewave Receiver Block Diagram

US 7,340,012 B2

SINGLE AND MULTIPLE SINEWAVE MODULATION AND DEMODULATION TECHNIQUES EMPLOYING CARRIER-ZERO AND CARRIER-PEAK DATA-WORD START AND STOP

PRIORITY CLAIM

This application is continuation in part of U.S. patent application Ser. No. 10/825,789, filed Apr. 16, 2004, now U.S. Pat. No. 7,046,741.

BACKGROUND OF THE INVENTION

1. Field of the Invention

The present invention relates to transmission of information through media such as wire, cable, and radio-frequency propagation, both terrestrial and satellite. More particularly, the present invention relates to a single and multiple sinewave modulation technique, apparatus for modulating and demodulating information according to the modulation technique, and communications systems employing the modulation technique.

2. The Prior Art

Digital data is often transferred from point to point by exploiting one or more of the three characteristic properties of an AC signal: Amplitude, Frequency and Phase.

Some of the modulation methods using the amplitude property are OOK (On-Off Keying) and common AM (amplitude modulation). In OOK a data bit is represented by the presence or absence of a carrier. In AM data bits are represented by a difference in the relative amplitude of the carrier or by using different tones representing the digital data to amplitude modulate a carrier.

Typical modulation methods using the frequency property are FSK (Frequency Shift Keying) and FM (frequency modulation). With FSK the binary states of digital data are represented with abrupt frequency changes between two predetermined fixed frequencies. In FM data bits are represented by a difference in the relative frequency of the carrier or by using different tones representing the digital data to frequency modulate a carrier.

Phase modulation is also a common modulation method also but when used alone is difficult to distinguish from FM. Recently more sophisticated modulation methods have evolved and have been exploited. As an example a relatively new and popular modulation method is QAM (Quadrature Amplitude Modulation), which uses a combination of amplitude and phase modulation. There are several different variations of QAM depending on the application.

Each of these modulation methods is viable, proven and used in appropriate communications applications. A few undesirable characteristics common to all of these modulation methods is they all require several cycles to transmit one bit and in doing so generate significant sidebands. These sidebands are necessary to extract the information from the carrier and take up significant bandwidth in the communications channel, requiring significant spacing between adjacent signals.

BRIEF DESCRIPTION OF THE INVENTION

A modulation technique according to the present invention employs one or more sinusoidal carriers. Digital data comprising a number of digital bits are encoded within each half of the sinusoidal cycle. Each individual one of n bits is located at a predetermined phase angle of the cycle $\theta_n$. One digital representation (for example a "zero") is represented by no change occurring in the amplitude Y of the sinusoidal waveform at the phase angle $\theta_n$. The other digital representation (for example a "one") is represented by altering the sinusoidal waveform at the phase angle $\theta_n$. As presently preferred, the sinusoidal waveform is altered by maintaining the amplitude $Y=\sin \theta_n$ for a short interval $\Delta\theta$ following the phase angle $\theta_n$. Alternatively, the sinusoidal waveform could be altered by increasing (or decreasing) the amplitude of the sinusoidal waveform and then maintaining the amplitude $Y=\sin \theta_{(n+\Delta\theta)}$ for the short interval $\Delta\theta$ following the phase angle $\theta_n$.

As presently preferred, but not necessary, every other bit is inverted (i.e., a "one" is inverted to a "zero" and a "zero" is inverted to a "one"). Either or both of the number of bits n and the phase angle $\theta_n$ may be adaptively altered or may be selectively altered for a number of purposes not relevant In embodiments where a plurality of sinusoidal carriers are employed, the sinusoidal carriers may be related in frequency such that they may be generated having a phase relationship characterized by all of the carriers simultaneously being at zero degrees (sin θ=0) periodically. This zero-degree phase coincidence can be used as a framing event for synchronizing different aspects of the data communications.

According to one aspect of the present invention, carrier-peak and carrier-zero detection can be employed in place of data start and stop bits, thus reducing the overhead and increasing the real data rate. Either carrier wave peaks or carrier wave zero crossings can be detected and used to frame data words in place of data-word start and stop bits. Use of this technique eliminates the use of two non-data overhead bits per data word.

A demodulation technique according to the present invention detects the modulated carrier and retrieves the digital data by examining it to determine whether the sinusoidal function of the carrier has been altered at an interval $\Delta\theta$ following each phase angle $\theta_n$. For, example, if the carrier has been modulated by maintaining the amplitude $Y=\sin \theta_n$ for a short interval $\Delta\theta$ following the phase angle $\theta_n$, the modulated carrier is examined to determine if $Y=\sin \theta_n$ during the interval $\Delta\theta$ following the phase angle $\theta_n$ or whether the amplitude has been following the function $Y=\sin \theta$ during the interval $\Delta\theta$ following each phase angle $\theta_n$. Such examination may be accomplished, for example, by mixing the detected sinusoidal carrier with a reference sinusoidal signal having the same frequency and phase as the carrier to detect phase differences between the reference sinusoidal signal and the modulated carrier, or by performing fast-fourier-transform (FFT) analysis on the modulated carrier. The digital data may then be buffered or otherwise processed and utilized as known in the digital data art.

An exemplary modulation apparatus according to the present invention may be employed to digitally generate the modulated carrier. A counter may be used to drive a digital-to-analog (D/A) converter through a sine-function lookup table as is known in the art to generate a sinusoidal output voltage from the D/A converter. The output of the counter at points in time representing $\theta_n$ may be latched into the sine-function lookup table if it is desired to maintain the output of the D/A converter at the value $Y=\sin \theta$ during the interval $\Delta\theta$. At the end of the interval $\Delta\theta$, the latch is released and the then-current-count output of the counter is presented to the lookup table. According to one embodiment of the invention, the bit rate is adaptable.

One exemplary demodulation apparatus according to the present invention may be employed to extract the digital information from the modulated carrier. The modulated carrier is used to generate a reference sinusoidal signal having the same frequency and phase as the modulated carrier. The modulated carrier and the reference sinusoidal signal are mixed in a double-balanced mixer. Digital circuitry examines the output of the mixer during a time window including and just following the interval $\Delta\theta$ for a signal indicating a phase change between the modulated carrier and the reference sinusoidal signal. The sensed signals become the digital output stream of the demodulator.

Another exemplary demodulation apparatus uses optical techniques to extract digital information from the modulated carrier. These techniques exploit the fact that the brightness of a LED will be higher during the presence of an encoded bit.

One communications system according to the present invention employs a modulator to insert at least one modulated carrier according to the present invention onto one end of a telephone line or other wire-pair communications line. Preferably, a plurality of such modulated carriers, separated in frequency by a guard-band amount, are injected into the line. A demodulator is coupled to the other end of the telephone line or other wire-pair communications line. According to one embodiment of the invention, a modulator and the demodulator may be located at each end of the line and the communications may be two-way communications. According to another embodiment of the invention, the modulator and the demodulator may negotiate a bit rate to be used in the communications.

Another communications system according to the present invention employs a modulator to insert at least one modulated carrier according to the present invention onto a power distribution line. Preferably, a plurality of such modulated carriers, separated in frequency by a guard-band amount, is injected into the line. A demodulator is coupled to the power distribution line at a customer location such as a home or business at, for example, a conventional duplex outlet. According to one embodiment of the invention, the communications may be two-way communications. According to another embodiment of the invention, the modulator and the demodulator may negotiate a bit rate to be used in the communications. According to yet another embodiment of the invention the communications system may be used by a power utility to regulate loads during periods of high load demand by selectively switching appliances and lighting circuits at the customer location.

Another communications system according to the present invention employs a modulator to insert at least one modulated carrier according to the present invention onto one end of a coaxial-cable communications line. The modulated carriers may be up-converted in frequency prior to being inserted onto the coaxial cable line. Preferably, a plurality of such modulated carriers, separated in frequency by a guard-band amount, is inserted into the line. A demodulator is coupled to the other end of the coaxial cable communications line. According to one embodiment of the invention, a modulator and the demodulator may be located at each end of the line and the communications may be two way communications. According to another embodiment of the invention, the modulator and the demodulator may negotiate a bit rate to be used in the communications.

Another communications system according to the present invention employs a modulator to generate at least one modulated carrier according to the present invention and to further modulate a radio-frequency (RF) carrier with the at least one modulated carrier to form a wireless RF signal. The modulated carriers may be up-converted in frequency prior to being RF modulated. Preferably, a plurality of such modulated carriers, separated in frequency by a guard-band amount, are RF modulated. The RF modulated signal is then transmitted. The transmitted RF modulated signal is then detected by a terrestrial RF receiver. A demodulator is coupled to the terrestrial RF receiver. According to one embodiment of the invention, the communications may be two-way communications. According to another embodiment of the invention, the modulator and the demodulator may negotiate a bit rate to be used in the communications.

Another communications system according to the present invention employs a modulator to generate at least one modulated carrier according to the present invention and to further modulate a radio-frequency (RF) carrier with the at least one modulated carrier to form a wireless RF signal. The modulated carriers may be up-converted in frequency prior to being RF modulated. Preferably, a plurality of such modulated carriers, separated in frequency by a guard-band amount, are RF modulated. The RF modulated signal is then transmitted to an earth-orbiting or other satellite or spacecraft. A demodulator is coupled to the RF receiver in the earth-orbiting or other satellite or spacecraft. The earth-orbiting or other satellite or spacecraft may then retransmit the RF signal to another RF receiver or may demodulate it for local use. According to one embodiment of the invention, the communications may be two-way communications. According to another embodiment of the invention, the modulator and the demodulator may negotiate a bit rate to be used in the communications.

BRIEF DESCRIPTION OF THE DRAWING FIGURES

FIG. 2 is a diagram illustrating a plurality of sinusoidal carriers that may be modulated according to the techniques of the present invention.

Figure 9A:
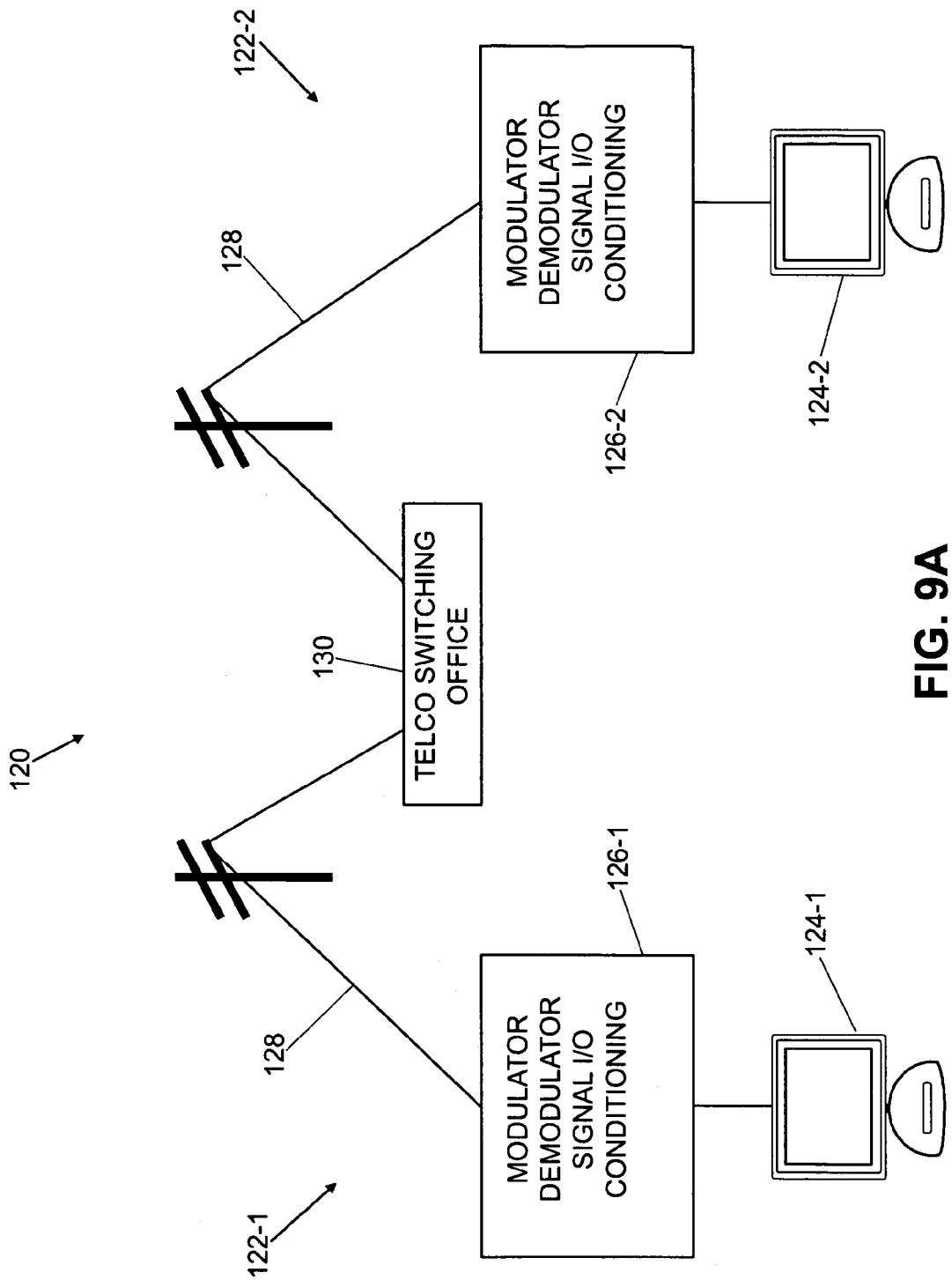

FIG. 9A is a block diagram illustrating a communications system according to the present invention operating over a wire-pair communications line such as a telephone line including a modulator on each end of a telephone line to insert at least one modulated carrier according to the present invention onto one end of the wire-pair communications line and a demodulator coupled to each end of the telephone line or other wire-pair communications line for performing two way communications.

Figure 9B:
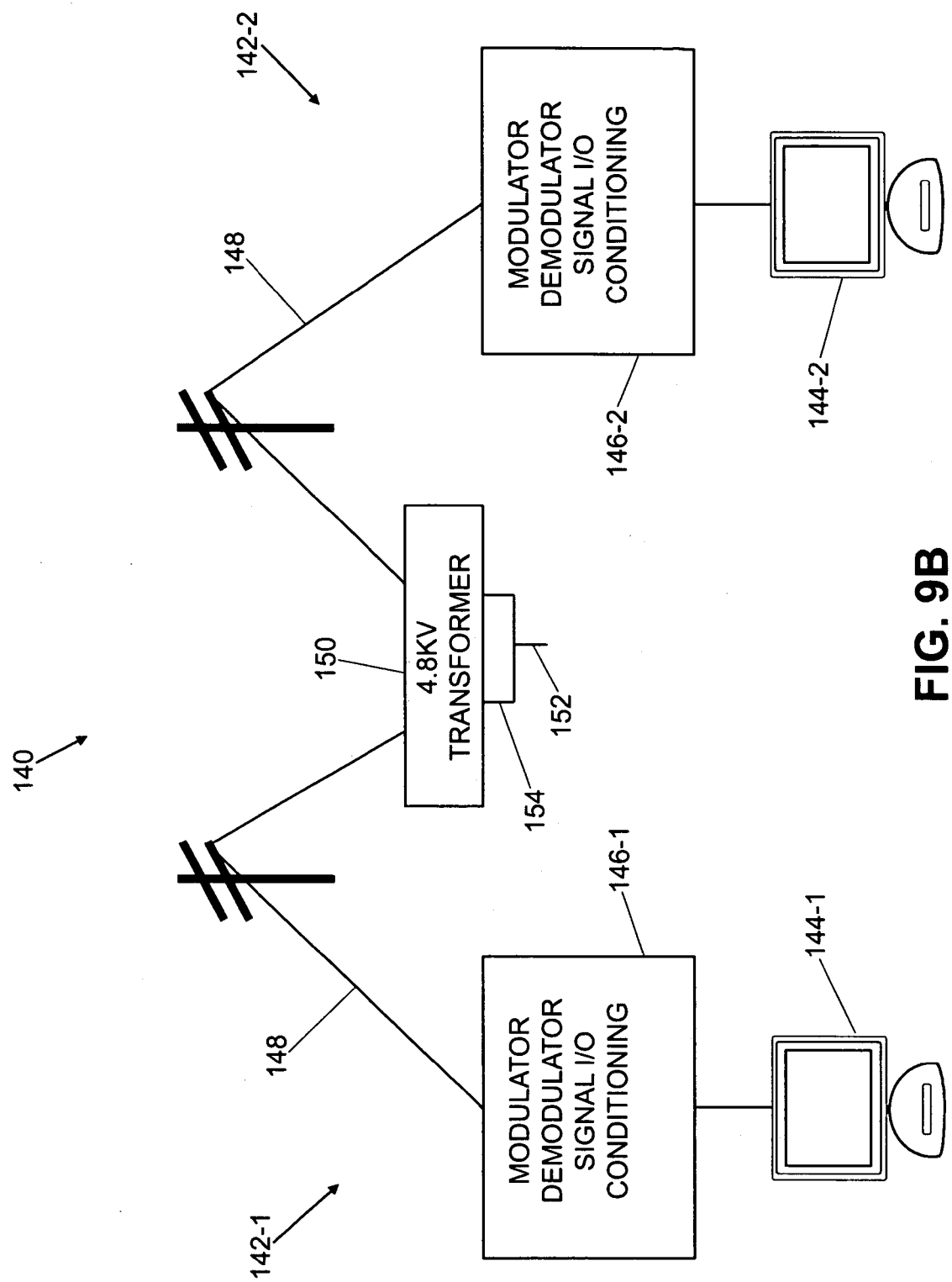

FIG. 9B is a block diagram illustrating a communications system according to the present invention operating over an electrical-power distribution line including a modulator coupled to the electrical-power distribution line to insert at least one modulated carrier according to the present invention onto one end of the electrical-power distribution line and a demodulator coupled to each end of the electrical-power distribution line for performing two way communications.

Figure 10:
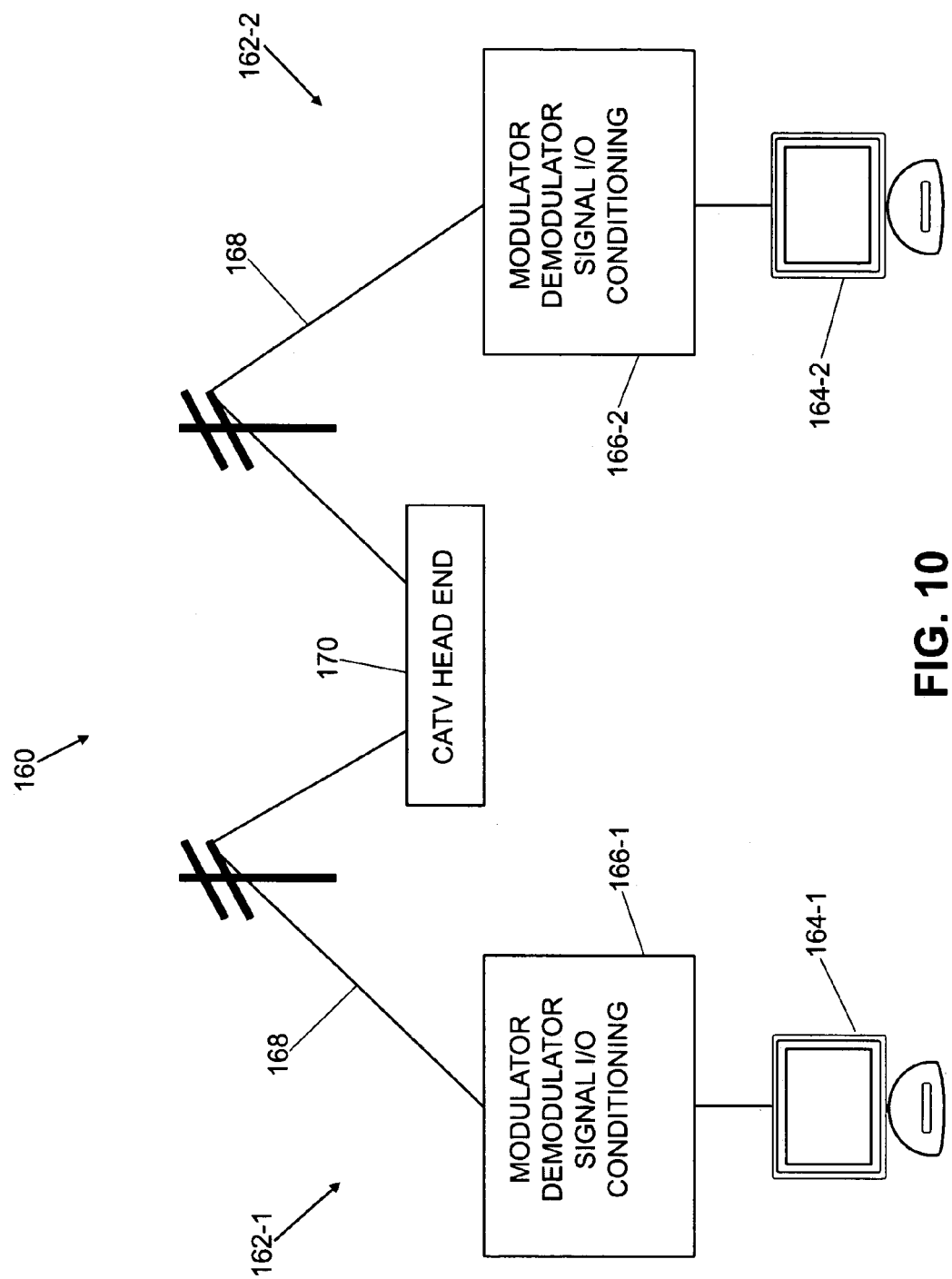

FIG. 10 is a block diagram illustrating communications system for a coaxial-cable communications line according to the present invention employing a modulator to insert at least one modulated carrier according to the present invention onto each end of the coaxial-cable communications line and a demodulator coupled to each end of the coaxial cable communications line.

Figure 11:
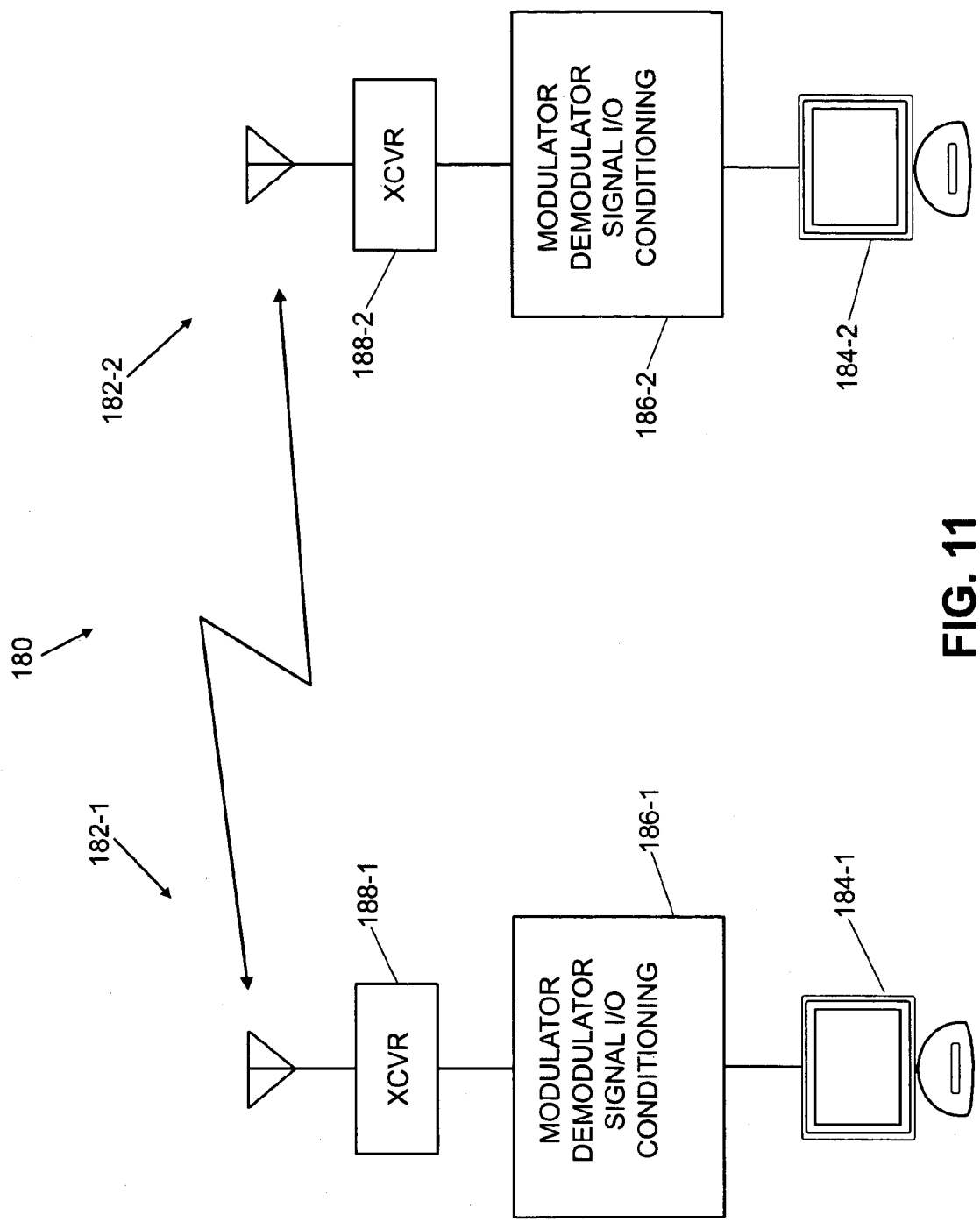

FIG. 11 is a block diagram illustrating another communications system according to the present invention employing on each end a modulator to generate at least one modulated carrier according to the present invention and to further modulate a radio-frequency (RF) carrier with the at least one modulated carrier to form a wireless RF signal and a terrestrial RF receiver coupled to a demodulator.

Figure 12:
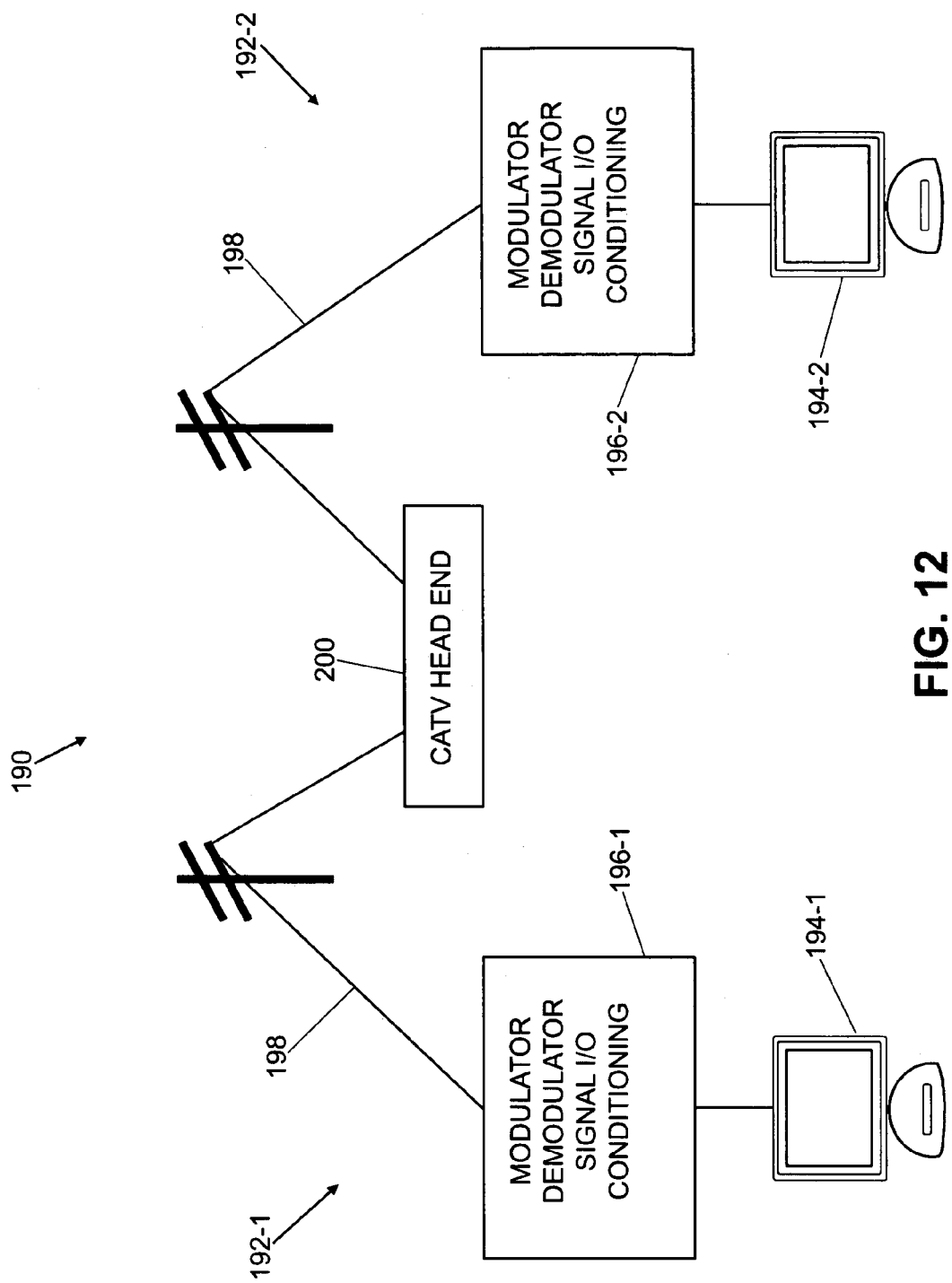

FIG. 12 is a block diagram illustrating another communications system according to the present invention employing on each end a modulator to generate at least one modulated carrier according to the present invention and to further modulate a radio-frequency (RF) carrier with the at least one modulated carrier to form a wireless RF signal transmitted to an earth-orbiting or other satellite or spacecraft and a demodulator coupled to the RF receiver in the earth-orbiting or other satellite or spacecraft.

Figure 13:
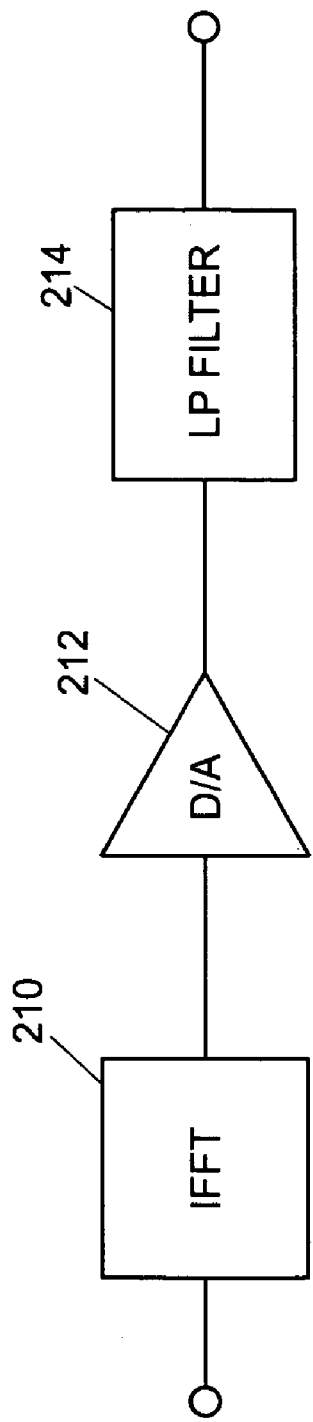

FIG. 13 is a block diagram illustrating how digital signal processing techniques may be used in a communications system according to the present invention to produce at least one modulated sinusoidal carrier as shown in FIG. 2.

Figure 14:
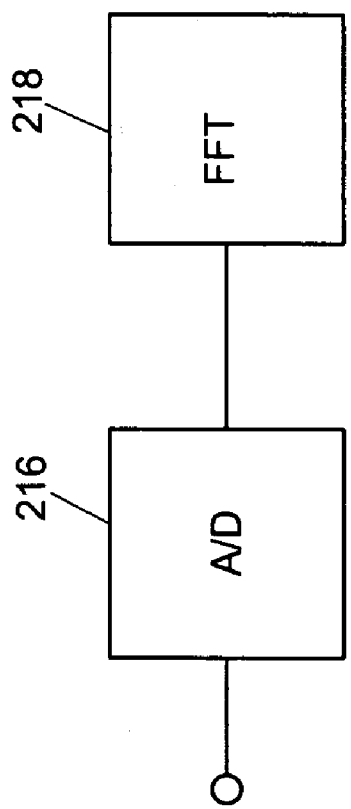

FIG. 14 is a block diagram illustrating how digital signal processing techniques may be used in a communications system according to the present invention to demodulate at least one modulated sinusoidal carrier.

Figure 15:
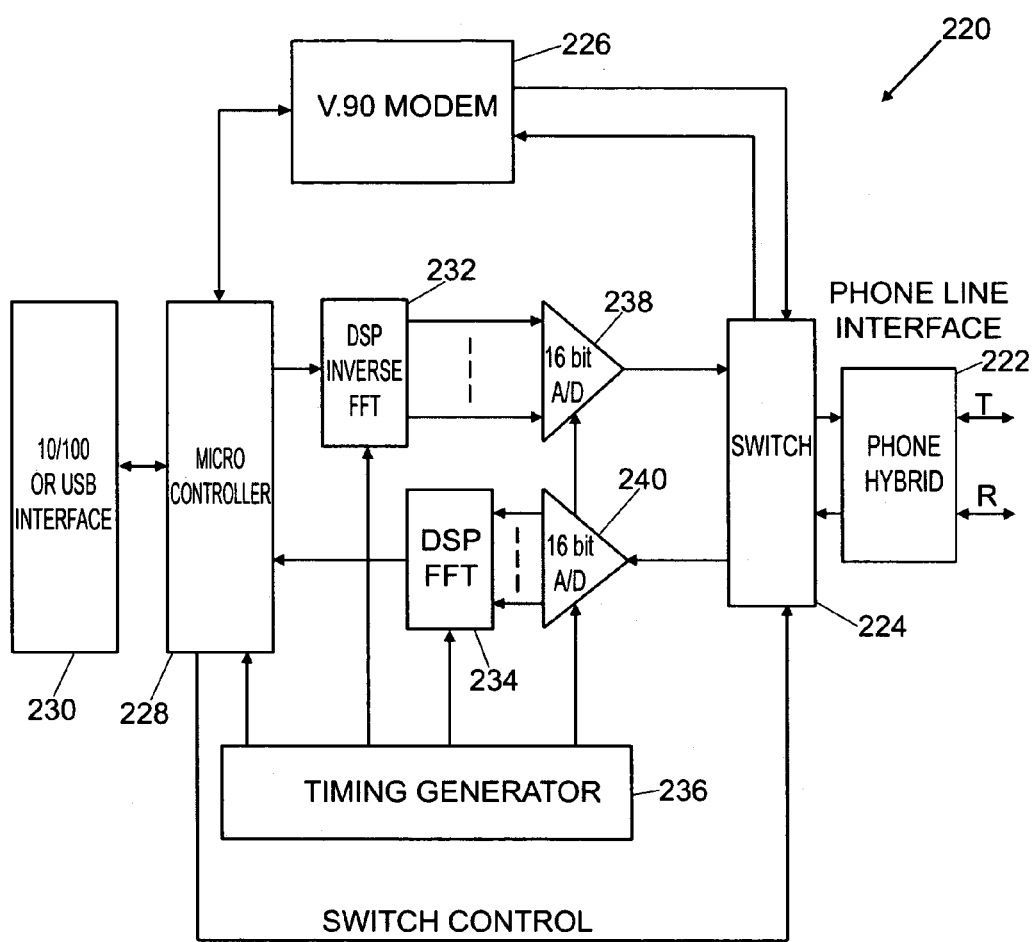

FIG. 15 is a block diagram illustrating how a communications system according to the present invention can be used in conjunction with an existing modem protocol.

Figure 16:
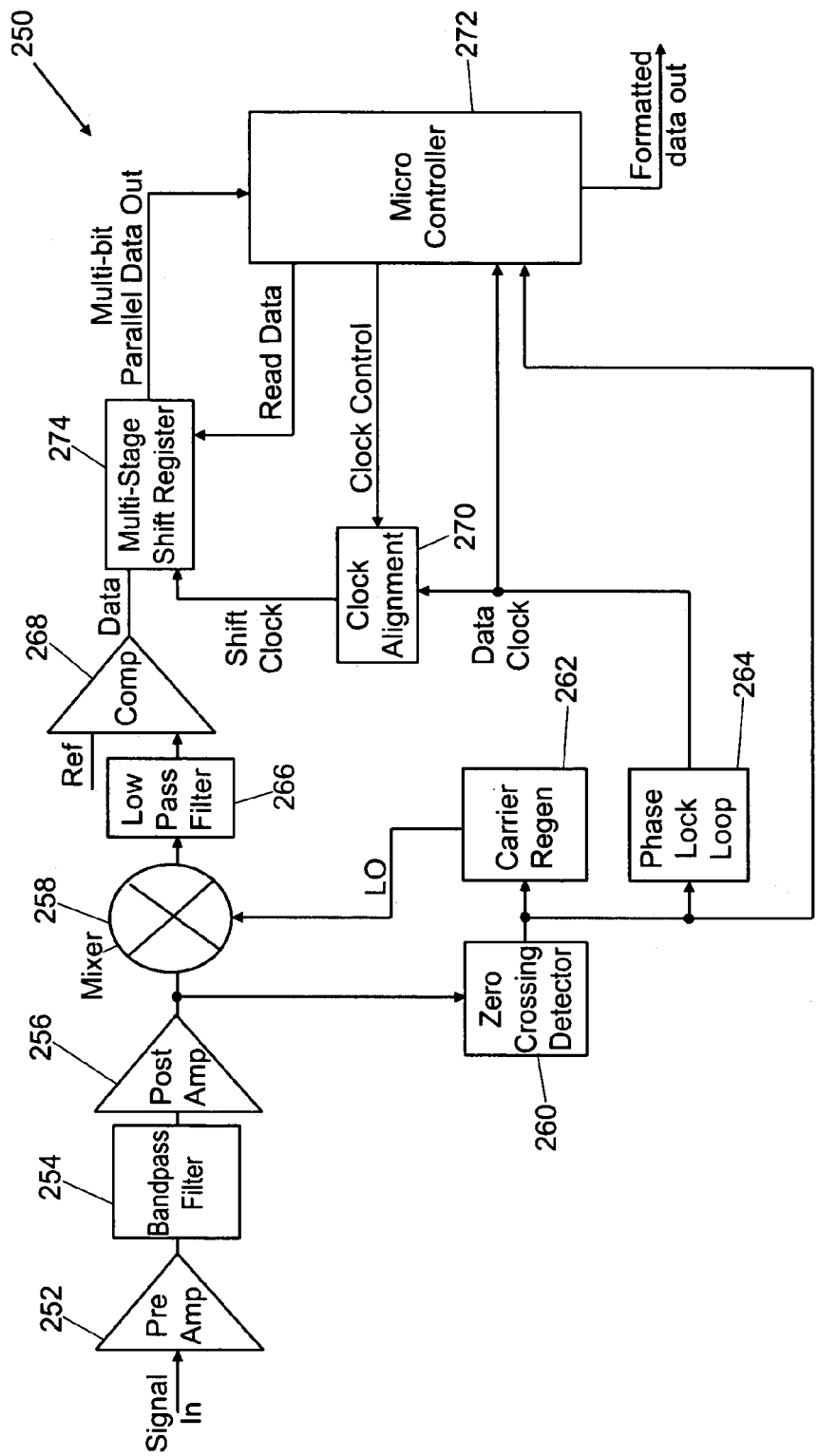

FIG. 16 is a block diagram that depicts an illustrative embodiment of a multi-frequency sinewave receiver.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1A:
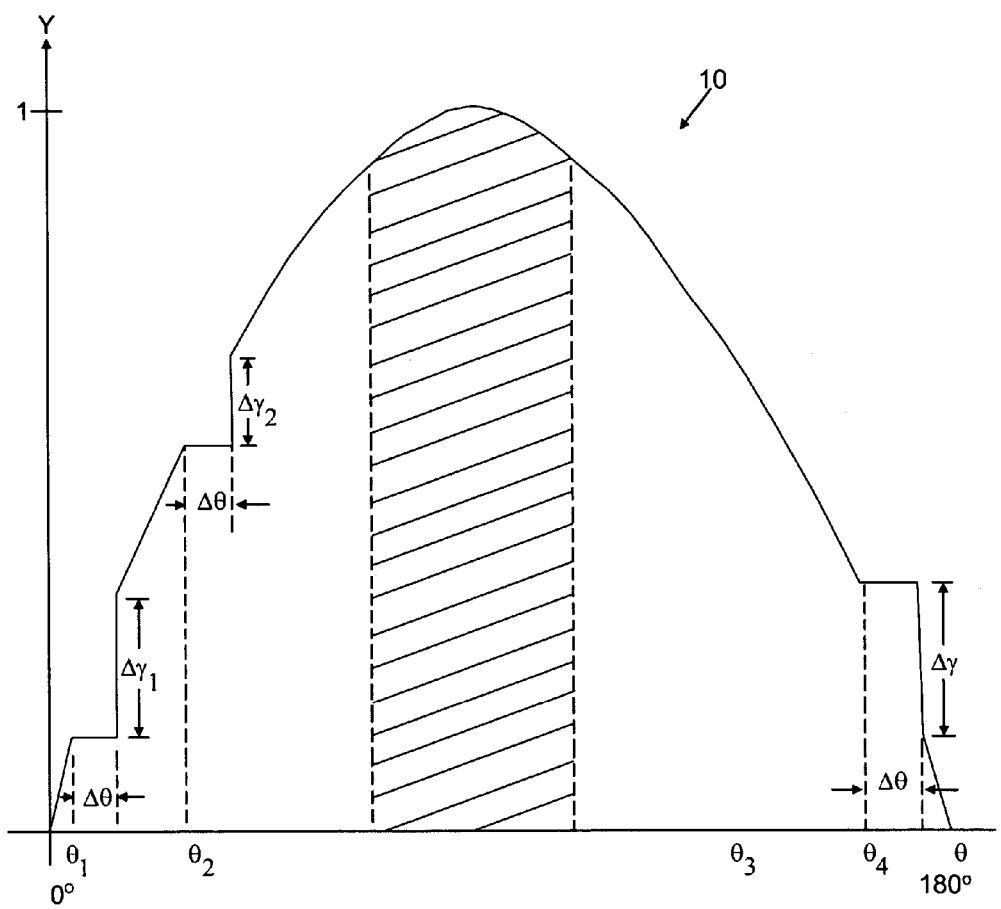
FIG. 1A is a diagram illustrating one half-cycle of an exemplary single sinusoidal carrier modulated according to the techniques of the present invention.

Referring first to FIG. 1A is a diagram illustrates an exemplary single sinusoidal carrier 10 modulated according to the techniques of the present invention. A positive half cycle of a sinusoidal wave is shown in FIG. 1A. The x-axis of FIG. 1A is the phase angle of the sinusoidal carrier 10 from 0° through 180° and the y-axis of FIG. 1A is the instantaneous amplitude of sinusoidal carrier 10 normalized to a peak value of 1 at a phase angle of 90° as is known in the art. Persons of ordinary skill in the art will appreciate from an examination of FIG. 1A how the encoding of the second half cycle of the sinusoidal carrier 10 from 180° through 360° is performed.

According to then present invention n digital bits are encoded within each half of the sinusoidal cycle. Each individual one of n bits is located at a predetermined phase angle of the cycle $\theta_n$. One digital representation (for example a "zero") is represented by no change occurring in the amplitude Y of the sinusoidal waveform at the phase angle $\theta_n$. The other digital representation (for example a "one") is represented by altering the sinusoidal waveform at the phase angle $\theta_n$. As presently preferred, the sinusoidal waveform is altered by maintaining the amplitude $Y=\sin \theta_n$ for a short interval $\Delta\theta$ following the phase angle $\theta_n$. As presently preferred, every other bit is inverted (i.e., a "one" is inverted to a "zero" and a "zero" is inverted to a "one"). Persons of ordinary skill in the art will appreciate that alterations of the sinusoidal carrier other than maintaining the voltage constant during the interval $\Delta\theta$ following the phase angle $\theta_n$ are possible in accordance with the teachings of the present invention. For example, the sinusoidal waveform could be altered by increasing (or decreasing) the amplitude of the sinusoidal waveform and then maintaining the amplitude $Y=\sin \theta_{(n+\Delta\theta)}$ for the short interval $\Delta\theta$ following the phase angle $\theta_n$. Combinations of these two techniques could be employed according to the present invention.

In FIG. 1A, n is selected to be 4 solely for purposes of ease in illustrating the present invention. The present invention is not limited to encoding 4 digital bits per half cycle of sinusoidal carrier 10 and persons of ordinary skill in the art will observe that other numbers of bits may be encoded per half cycle of sinusoidal carrier 10. The locations of the encoded bits on the carrier 10 are shown at phase angles $\theta_1$, $\theta_2$, $\theta_2$, and $\theta_4$, respectively. These bit positions are shown in FIG. 1A symmetrically located. Such positioning, while convenient for performing the demodulation of the signal, is not necessary in accordance with the present invention.

For purposes of FIG. 1A, a "zero" data value is represented by no change occurring in the amplitude Y of the sinusoidal waveform and a "one") is represented by altering the amplitude Y of the sinusoidal waveform. In the example of FIG. 1A, a modulation technique is used wherein every other bit is inverted (i.e., a "one" is inverted to a "zero" and a "zero" is inverted to a "one"). Therefore, bits 2 and 4 are shown inverted in FIG. 1A. While this modulation technique (inverting every other bit) is presently preferred, persons of ordinary skill in the art will appreciate that this is not necessary for practicing the present invention.

FIG. 1A illustrates encoding the four-bit sequence 1000, in which bits 2 and 4 are inverted so that the encoded sequence is shown as 1101 encoded in the first half cycle of sinusoidal carrier 10. Thus, starting at phase angle $\theta_1$ and for a short interval $\Delta\theta$ following the phase angle $\theta_1$, the sin $\theta$ function becomes discontinuous and the Y value is held constant at the value $Y=\sin\theta_1$. At the end of the interval $\Delta\theta$, the Y value jumps up to $Y=\sin[\theta_1+\Delta\theta]$. Similarly, starting at phase angle $\theta_2$ and for a short interval $\Delta\theta$ following the phase angle $\theta_2$, the $\sin\theta$ function becomes discontinuous and the Y value of the function is held constant at the value $Y=\sin\theta_1$, since an inverted "0" (a "1") is being encoded. At the end of the interval $\Delta\theta$, the Y value rises to $Y=\sin[\theta_2+\Delta\theta]$. There is no interruption of the $\sin\theta$ function at the angle interval $\Delta\theta$ immediately following phase angle $\theta_3$, since a zero is being encoded at that location. Finally, starting at phase angle $\theta_4$ and for a short interval $\Delta\theta$ following the phase angle $\theta_4$, the Y value of the function is held constant at the value $Y=\sin\theta_4$, since an inverted "0" (a "1") is being encoded. At the end of the interval $\Delta\theta$, the Y value falls to $Y=\sin[\theta_2+\Delta\theta]$.

From an examination of the first and fourth encoded bits, persons of ordinary skill in the art will observe that the portions of the waveform at encoded bits at phase angles $\theta_1$ and $\theta_4$ are not symmetrical. At phase angles of less than 90° the rise of the Y value is delayed and at phase angles of greater than 90° the fall of the Y value is delayed. In both cases, however, the abrupt change in the Y value ($\Delta Y$) occurs at the end of the interval $\Delta\theta$, during which Y has been constant. This is the abrupt change that will be sensed by the detector to demodulate the signal and extract the digital information. As previously noted, persons of ordinary skill in the art will appreciate that at phase angles greater than 90° the abrupt change could be caused to occur at the beginning of the interval $\Delta\theta$ or that the abrupt change in amplitude could be at the beginning of the interval at phase angles less than 90° and at the end of the interval at phase angles greater than 90°.

A central portion of the sinusoidal carrier 10 symmetrically located around 90° is identified in FIG. 1A by diagonal hatching. It is believed that, as a practical matter, there is some range of phase angles symmetrically located around 90° for which the abrupt change $\Delta Y$ in the value of Y will be difficult or impossible to detect since $d\sin\theta/d\theta$ (i.e., $\cos\theta$) approaches zero as $\theta$ approaches 90° from both directions. This can be seen by comparing $\Delta Y1$ and $\Delta Y2$ and noting that the latter is a smaller amplitude change. It is therefore presently preferred to avoid locating the bit positions near the phase angle $\theta=90°$. The size of this exclusion zone will depend on factors such as, but not limited to, the detection scheme employed, the transmission medium employed, and the ambient noise level in the transmission medium.

Persons of ordinary skill in the art will appreciate that variations of the modulation technique disclosed with reference to FIG. 1A are possible without departing from the concepts of the present invention. For example, this aspect of the invention has been disclosed with respect to use of a constant phase-angle interval $\Delta\theta$ to produce a resultant abrupt change in the value of abrupt change in the voltage value of Y. It is also contemplated to use a constant abrupt change in the voltage value $\Delta Y$ with the result that the magnitude of the phase-angle interval $\Delta\theta$ will depend on the angular position at which the change in the voltage value $\Delta Y$ is desired. In addition, the voltage during the interval $\Delta\theta$ in the example of FIG. 1A is held constant at the value $Y=\sin\theta_n$, but other functions could be employed.

Figure 1B:
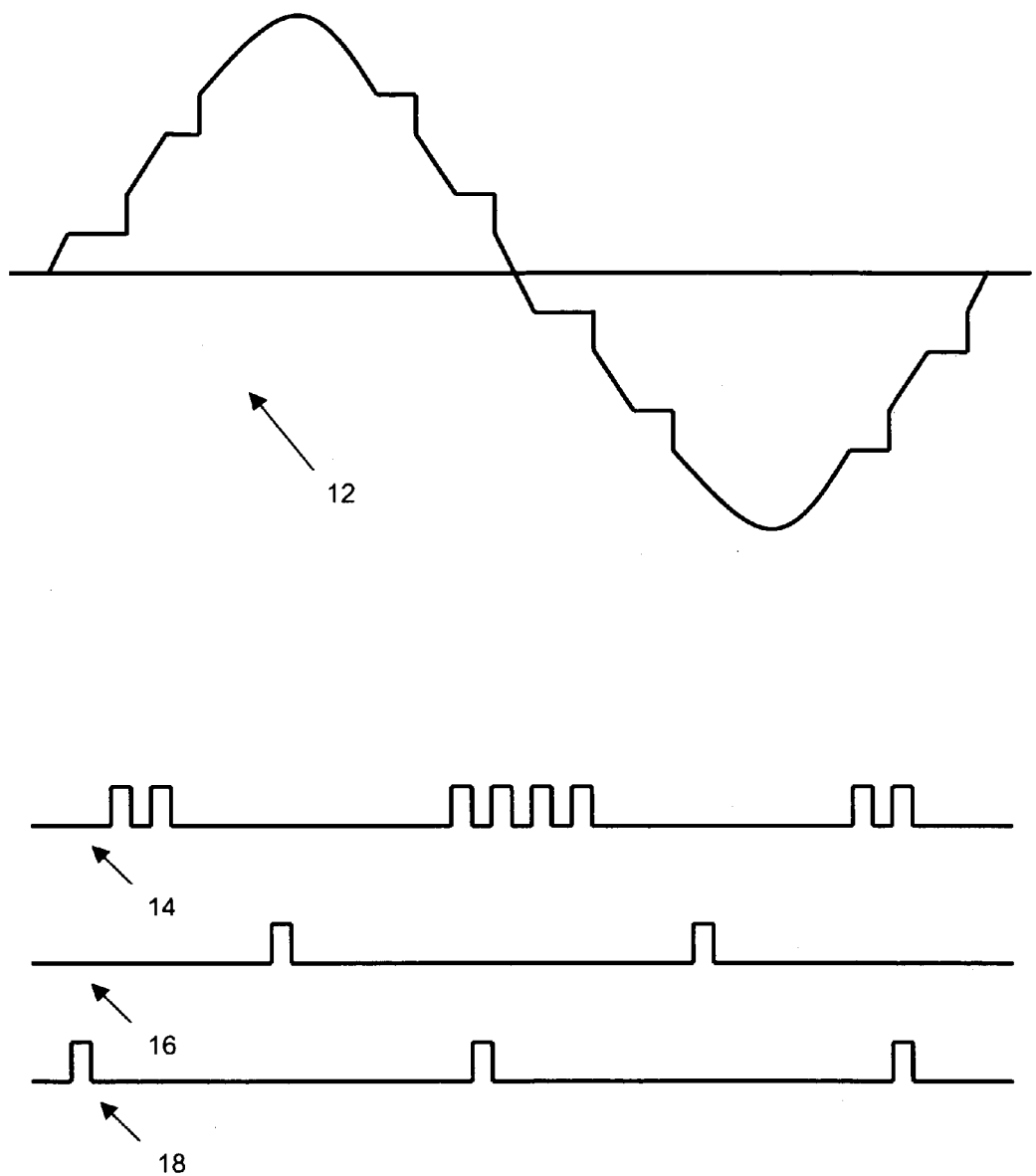
FIG. 1B is a graph of voltage vs. time showing a single cycle of a sinewave carrier modulated according to the techniques of the present invention, exemplary data detected from that carrier, and word-start and word-stop sync pulses derived from a choice of either peak detection and zero-crossing detection of the sinewave carrier.

Referring now to FIG. 1B, a graph of voltage vs. time of a single cycle of a sinewave carrier modulated according to the techniques of the present invention and of exemplary data detected from that carrier is presented. In the first trace 12, a single cycle of a sinewave carrier is shown modulated with eight bits per 360° cycle. For purposes of illustration, all of the bits are "one." Any zero bit would have been shown as a region of no deviation from the sinusoidal function at the bit-position phase angle.

In the second trace 14 of FIG. 1B, a representation is shown of the voltage that would be detected from that carrier using the techniques of the present invention. The absence of encoded data in the region symmetrical about 90° is noted.

In the third trace 16 of FIG. 1B, a representation is shown of the sync bits that would be generated at the output of a peak detector. The fourth trace 18 shows a representation of the sync bits that would be generated at the output of a zero-crossing detector. It is presently preferred to frame words using peak-detector sync bits rather than using zero-crossing-detector sync bits. The data exclusion zones adjacent to the wave minima and maxima at phase angles of 90° and 270° are believed to provide better assurance against data-word framing errors since, as seen from viewing the second, third, and fourth traces together, the time spacing of the data bits and the zero-crossing sync bits is closest around the sinewave zero crossings at phase angles of 0° and 180°. The spacing between the data bits and the minima and maxima sync bits is much larger at the positive and negative peaks at phase angles of 90° and 270°.

Peak detection and zero detection techniques are well known and can be applied to generate the word-framing start and stop bits of the demodulation techniques of the present invention. For example, zero-crossing detection may be accomplished by using known voltage comparator circuits, and peak detection may be accomplished using known differentiator circuits. As previously mentioned, timing errors in a peak-detection circuits are better tolerated than such errors in a zero-crossing detection circuit. Phase-locked loop techniques may also be used to generate the peak and zero-crossing sync signals. Since zero-crossing detection is easier to implement than peak detection, the incoming sinewave carrier can be differentiated to derive a cosine waveform that is exactly 90° phase shifted from the original sine wave. The resulting cosine wave can be fed to the zero-detection circuit. As will be appreciated by persons of ordinary skill in the art, the zero-crossings of the cosine wave correspond to the minima and maxima peaks of the original sine wave.

Persons of ordinary skill in the art will appreciate that the generation of word-start and word-stop bits according to the present invention can significantly increase the data throughput by eliminating the need for inserting start-bits and stop-bits in the data stream. As an example, an eight-bit data word framed with a start bit and a stop bit comprises ten bits. By eliminating the start bit and the stop bit, only the eight data bits need to be transmitted, resulting in a bit-throughput overhead savings of 20%. In a system using sixteen-bit words, sixteen bits instead of eighteen bits need to be transmitted, resulting in a bit-throughput overhead savings of almost 9%.

Referring now to FIG. 2, a diagram illustrates another aspect of the present invention in which a plurality of sinusoidal carriers may be modulated with different digital data in the same communications channel according to the techniques of the present invention. In the illustrative example of FIG. 2, it may be seen that portions of seven sinusoidal carriers are shown within a 40 mS "frame" wherein all of the carriers are at a phase angle of zero at the beginning of each frame. Persons of ordinary skill in the art will understand that this can be readily accomplished by selecting carrier frequencies that are mathematically related in frequency. In the illustrative example of FIG. 2, carrier frequencies starting at 400 Hz and spaced apart by 25 Hz (i.e., 250 Hz, 275 Hz, 300 Hz, 325 Hz, 350 Hz, 375 Hz, and 400 Hz have been selected. As shown in the particular example illustrated in FIG. 2, the use of 16 bits per cycle results in a data rate of 1,456 bits per frame or 36,400 bits per cycle.

As may be seen from FIG. 2, the carriers are mathematically related such that ten complete cycles of a first carrier, eleven complete cycles of a second carrier, twelve complete cycles of a third carrier, thirteen complete cycles of a fourth carrier, fourteen complete cycles of a fifth carrier, fifteen complete cycles of a sixth carrier, and sixteen complete cycles of a seventh carrier are contained within the frame. Such framing, wherein all of the carriers are at a phase angle of zero at the beginning of each frame, is not necessary for practicing the present invention using multiple carriers, but it may be advantageously employed for data recovery and other synchronization activities in a communications system according to the present invention. For example, the frame-start phasing illustrated in FIG. 2 may be used for synchronization purposes etc.

This multiple-carrier aspect of the present invention can be employed to expand the total bandwidth that may be available in a given communications channel. For example, as will be disclosed herein, the bandwidth of a typical twisted-pair telephone line is about 3 KHz. According to the present invention, a plurality of sinusoidal carriers may each be spaced about 50-100 Hz apart in frequency within this frequency range and transmitted over the same telephone line. This can be used to significantly increase the usable bandwidth in any communication channel in which the present invention is employed. Persons of ordinary skill in the art will recognize from this disclosure that other frequency separations will be useable at other frequencies. For example, at a frequency of about 100 MHz, a plurality of sinusoidal carriers may be spaced apart from one another by about 500 KHz. Persons of ordinary skill in the art will understand that, in any given system realized according to the present invention, the required carrier spacing is simply that necessary to avoid interference from adjacent carrier frequencies during detection and will depend on the frequency range utilized, as well as the detection techniques that are employed.

According to another aspect of the present invention, secure communications may be accomplished by selecting combinations of two or more carrier frequencies. Authorized transmissions in such a system may be identified by receivers configured to detect the presence of the selected combination of carrier frequencies. According to one aspect of the present invention, communications systems may be adaptive and may use information sent over a control channel or frequency shifts detected by the receiver to shift the frequency of one or more carriers for purposes such as noise avoidance or minimization, security purposes, enabling multiple modes of communications, identifying messages intended for selected receivers, identifying events, etc. The purposes for which this aspect of the invention may be implemented will vary widely and are largely a matter of design choice.

Figure 3:
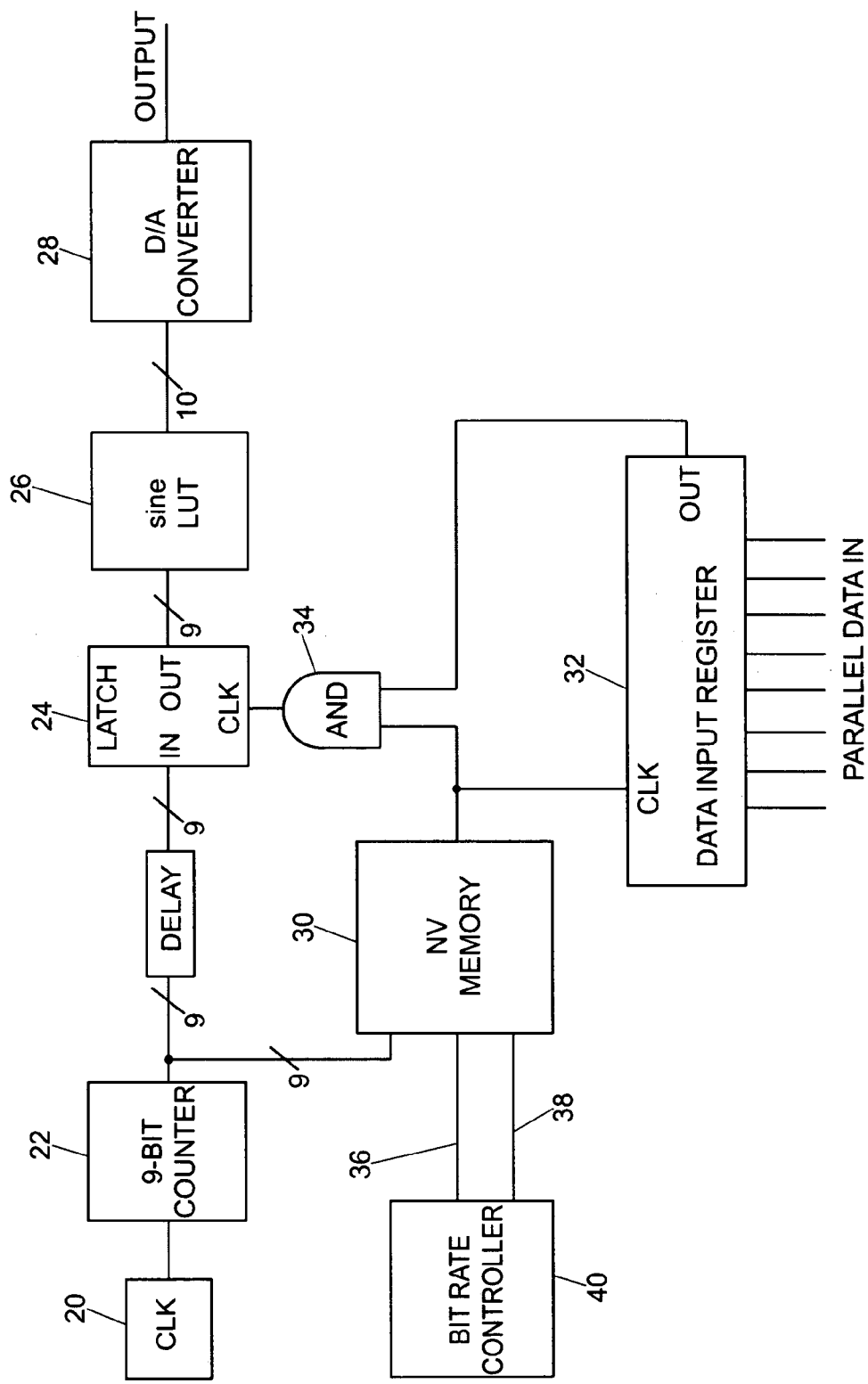
FIG. 3 is a block diagram of an illustrative modulator circuit for generating a modulated sinusoidal carrier according to the techniques of the present invention.

Referring now to FIG. 3, a block diagram depicts an illustrative modulator circuit for generating a modulated sinusoidal carrier according to the techniques of the present invention. The modulator of FIG. 3 is only illustrative, and persons of ordinary skill in the art will recognize that other schemes, such as a programmed microprocessor and digital signal processing (DSP) techniques, state machines, etc., may be employed to perform this function.

Generation of a sinusoidal voltage by use of a sine-function lookup table driving a D/A converter is known. The phase angles from 0° to 360° are quantized to a number of discrete values. A multi-bit counter continuously counts through these discrete values at a constant clock rate. The output of the multibit counter addresses the sine-function lookup table that provides the digital encoded sine-function value for each quantized phase angle. The D/A converter outputs a voltage proportional to the sine of the discrete phase angle at the input of the lookup table.

The two variables are the phase-angle resolution and the resolution of the A/D converter. In the illustrative modulator circuit of FIG. 3, the phase angle range of 0° to 360° is shown resolved to 9 bits, or one part in 512, making each increment of $\theta = 0.703125°$. Persons of ordinary skill in the art will appreciate that other resolutions could be employed, although the number of bits that may be encoded in a half cycle of the sinusoidal carrier may be limited for smaller resolutions. For example, using a 9-bit resolution of $\theta$, each half cycle is resolved into 256 discrete angles. It is believed that a practical limit of 64 bits may be achievable using this angular resolution.

Similarly, the resolution of the D/A converter should be selected so that the step size is small enough to provide a relatively low amount of distortion in an unmodulated sinusoidal carrier generated therefrom. It is presently preferred that the resolution of the D/A converter be at about 10 bits. Persons of ordinary skill in the art will appreciate that the resolution of the D/A converter will affect the ability to use FFT demodulating techniques, since it is desirable that the smallest contemplated $\Delta Y$ be significantly larger than the D/A step size.

Discrete logic elements are depicted in FIG. 3. Persons of ordinary skill in the art will appreciate that these elements can be fabricated using different technologies such as bipolar technology, CMOS technology, etc., and that logic families such as TTL, ECL, etc., may be chosen depending on the speed requirements dictated by the operating frequencies for which the circuits are designed. Further, such skilled persons will understand that these elements may be integrated onto a single integrated circuit, or that these elements could be programmed into a programmable integrated circuit such as a field programmable gate array or that the logic functions performed could be realized as a state machine.

In FIG. 3, clock generator 20 is shown driving 9-bit binary counter 22. The 9-bit count output from counter 22 is provided through delay element 24 to latch 26. Latch 26 is configured to be transparent while its clock input is low and to latch at its output the 9-bit value appearing on its input when its clock input becomes high. The output of latch 26 is used to drive sine lookup table 28. The output of sine lookup table 28 drives D/A converter 30. D/A converter 30 is shown in FIG. 3 having a resolution of 10 bits in FIG. 3, but from this disclosure, persons of ordinary skill in the art will understand that different resolutions may be employed. The modulated sinusoidal carrier of FIG. 1A appears at the output of D/A converter 30. Persons of ordinary skill in the art will appreciate that, in the 9-bit counter example of FIG. 3, the frequency of clock generator 20 is selected to be 512 times the desired sinusoidal carrier frequency.

Modulation may be applied to the sinusoidal carrier by temporarily freezing the input to sine lookup table 28 for a number of clock pulses whose periods together equal the desired time interval corresponding to $\Delta\theta$. Experienced digital designers will appreciate that there are numerous ways in which to accomplish this.

One illustrative example of an extremely flexible method for performing this modulation technique is shown in FIG. 3 using non-volatile memory 32. Non-volatile memory 32 may be any sort of non-volatile memory, such as a mask ROM, PROM, EPROM, EEPROM, flash memory, etc.

The 9-bit count output from counter 22 is also provided to the 9 least significant bits of non-volatile memory 32, which then has one location corresponding to each discrete phase angle into which the sinusoidal carrier is resolved. In the circuit of FIG. 3, memory locations in non-volatile memory 32 corresponding to phase angles in the ranges [$\theta_1+\Delta\theta$], [$\theta_2+\Delta\theta$], [$\theta_3+\Delta\theta$], and [$\theta_4+\Delta\theta$] contain the value "1" and memory locations in non-volatile memory 32 corresponding to phase angles outside of these ranges contain the value "0".

The data to be encoded is transferred to data input register 34. Data input register 34 is a parallel-in serial-out register. Data input register 34 is loaded with n bits of data, n being the number of bit positions that may be encoded into a half cycle of the sinusoidal carrier. Data input register 34 is falling-edge clocked by the data output of non-volatile memory 32. Prior to the first clock pulse, the first data bit appears at the serial output of data input register 34. When the output count of 9-bit counter 22 reaches the value corresponding to the phase angle location of the first data bit to be encoded, the output of non-volatile memory 32 presents a "1" value as previously disclosed. If the value of the first data bit appearing at the serial output of data input register 34 is also a "1" value, the output of AND gate 36 becomes true (a value of "1"). This latches the count of 9-bit counter 22 at the output of latch 26, causing the output of D/A converter 30 to remain constant. From an examination of FIG. 3, persons of ordinary skill in the art will appreciate that delay element 24 is interposed in the output path of counter 22 to allow the output of nonvolatile memory 32 and the output of AND gate 36 to settle prior to the new count reaching latch 26.

During this time, 9-bit counter 22 continues to count and its output sequentially addresses the contents of non-volatile memory 32. So long as the output of non-volatile memory 32 presents a "1" value to AND gate 36, the output of latch 26 remains latched. When the output of non-volatile memory 32 drops to a "0" value, AND gate 36 releases latch 26 and the current output count of 9-bit counter 22 is presented to lookup table 28, causing the output of D/A converter 30 to immediately rise (or fall) to the value of $Y=\sin\theta$ for the current value of $\theta$ represented by the current output count of 9-bit counter 22.

As previously noted, there are numerous ways in which to modulate the sinusoidal carrier by temporarily freezing the input to sine lookup table 28 for a number of clock pulses whose periods together equal the desired time interval corresponding to $\Delta\theta$. One advantage of employing the scheme shown in FIG. 3 using non-volatile memory 32 is that the positions of the data bits at phase angles $\theta_1$, $\theta_2$, $\theta_2$, and $\theta_4$, and the intervals $\Delta\theta$ can be collectively or individually adjusted simply by programming the contents of non-volatile memory 32. For, example, as previously disclosed herein, the lengths of intervals $\Delta\theta$ can be individually adjusted in order to cause substantially-equal $\Delta Y$ changes for representing "1" value bits.

Another advantage obtained by employing non-volatile memory 32, as shown in FIG. 3, is that the bit rate of the modulation may be selectively altered. Non-volatile memory 32 is shown including higher-order-bit address inputs 38 and 40, controlled by bit-rate controller 42. This example allows addressing four separate segments of non-volatile memory 32. Each segment may be programmed with data representing different numbers of bit-encoding phase angles, different intervals for $\Delta\theta$, or different combinations of both parameters.

As will be appreciated by persons of ordinary skill in the art, bit rate controller 42 may be configured to adaptively and dynamically alter the bit rate and/or the intervals for $\Delta\theta$ modulation in response to changing conditions within the communication channel in which the modulator of the present invention is employed. As a non-limiting example, this technique could be used to negotiate connection speed over twisted-pair telephone lines as is done in present-day dial-up modems. Similarly, this technique may be employed to alter the bit rate of the modulation technique of the present invention in any communications channel in which it is employed to compensate for dynamically-changing conditions, such as noise, etc., in the communications channel.

As will also be appreciated by persons of ordinary skill in the art, the bit rate and/or one or more of the phase-angle positions for $\Delta\theta$ modulation can be switched using bit-rate controller 42 and additional address lines to access other memory locations for other purposes. Such purposes include identifying synchronization frames, identifying packet headers for use in IP or other packet protocol systems, or identifying other events or conditions. In this manner, detection of "out-of-position" bits in received carriers can be assigned meanings such as identifying events, providing additional data, etc. These meanings may change depending on where in a "frame" this activity occurs.

The nature of bit-rate controller 42 will depend to a large extent on the nature and architecture of the system in which the modulator is disposed and on the conditions that will be used to alter the bit rate or the bit phase-angle positions. As an example, bit-rate controller 42 could be configured as a state machine, a microcontroller or a microprocessor. Configuration of the state machine and/or programming of the microcontroller or microprocessor will, of course, depend on the exact process that is being performed and is a routine task for a person of ordinary skill in the art.

As a general example, however, bit-rate controller may be conditioned to sense the presence of a condition, request, interrupt, event, or the like, and assert an address to a location in memory 32 that contains the data to produce the number of bits desired and/or set one or more bit positions at desired phase angles of the sinusoidal carrier to effect the specific response to the condition, request, interrupt, event, or the like. If additional data is being encoded, one phase-angle setting of the bit positions in the sinusoidal carrier can represent a first digital state (e.g., a "zero") and a second phase-angle setting of the bit positions in the sinusoidal carrier can represent a second digital state (e.g., a "one").

A receiver for demodulating the modulated sinewaves of the present invention may be conditioned to detect one or more "out-of-position" bits in one or more carriers and perform different actions based upon the detection and the meanings assigned to the condition. One advantage of employing this technique according to the present invention is that this may be accomplished while still utilizing the detected data, meaning that this increase in function may be obtained without degrading the bandwidth of the communications channel. For example, a carrier presenting "out-of-position" encoded bits could be used to signal that the system is about to increase or decrease the number of carriers in the channel. Persons of ordinary skill in the art will understand that the uses for this additional intelligence capability of the present invention are virtually limitless and are adaptable to the particular configuration and end use of the system in which they are employed.

The output of D/A converter 30 may be buffered, and/or mixed with outputs of D/A converters from other modulators as disclosed herein, and may be otherwise further conditioned, e.g., by further modulation or frequency conversion as necessary to prepare signals for insertion into various communication channels. This aspect of the present invention is illustrated in FIGS. 4A and 4B, to which attention is now drawn.

Figure 4A:
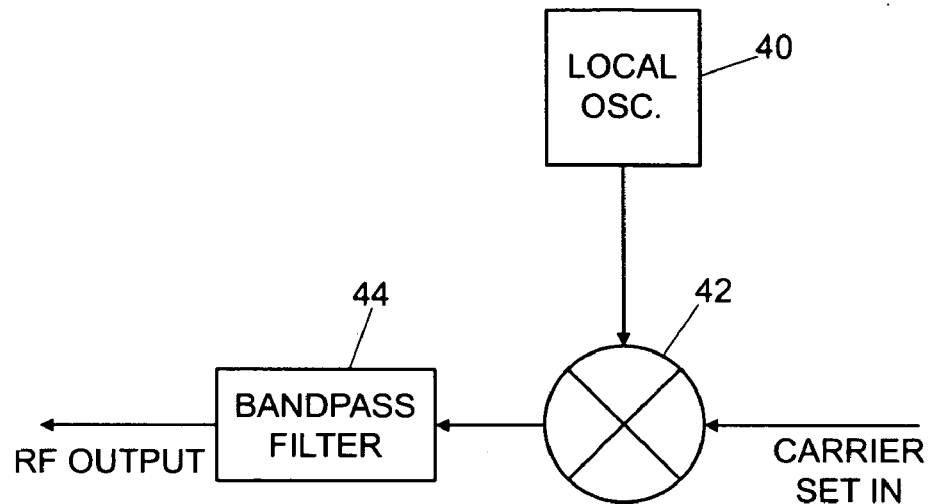
FIGS. 4A and 4B are, respectively, block diagrams of a frequency up converter and down converter that may be used in communications systems according to the present invention.

FIG. 4A is a block diagram of a frequency up converter that may be used for preparing modulated carriers for transmission in communications systems according to the present invention. Local oscillator 40 drives one input of balanced RF mixer 42. A modulated sinewave carrier set is presented to the other input of balanced RF mixer 42. The output of balanced RF mixer 42 is passed through bandpass filter 44. The arrangement of FIG. 4A for use as an upconverter is well known in the RF art.

Figure 4B:
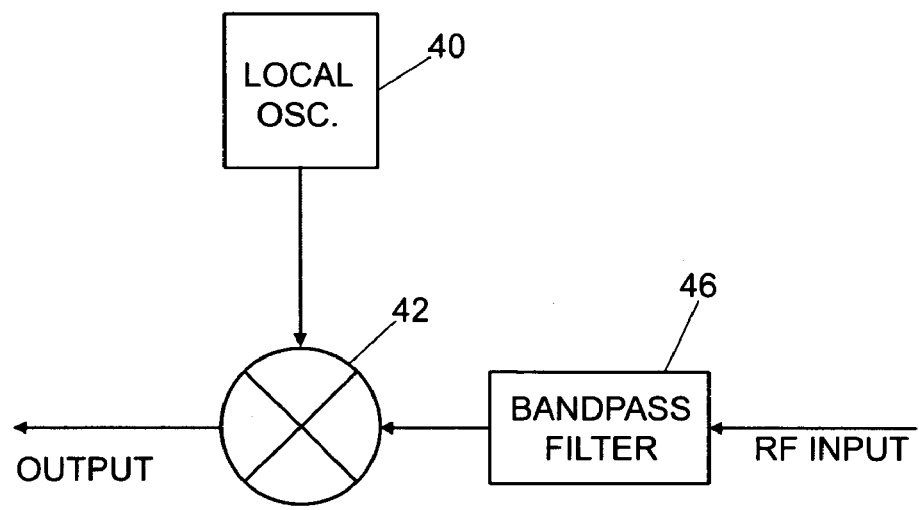

FIG. 4B is a block diagram of a frequency down converter that may be used for downconverting received modulated carrier signals in communications systems according to the present invention. As in FIG. 4A, local oscillator 40 drives one input of balanced RF mixer 42. The received RF input presented to the other input of balanced RF mixer 42 through bandpass filter 46. The output of balanced RF mixer 42 is passed to a detector of the type disclosed herein. The arrangement of FIG. 4B for use as a downconverter is also well known in the RF art.

As an example, of the use of upconverters and downconverters in the context of the present invention, carriers at frequencies in the 1 MHz range can be frequency converted to the 100 MHz range for transmission over coaxial cable communications channels, and 100 MHz range can be frequency converted to the gigahertz range for transmission over microwave-link communications channels such as terrestrial point-to-point links or satellite links. Techniques for such signal conditioning and frequency conversion are well known in the art.

Another aspect of the invention is illustrated in FIG, 5A, which is a block diagram of a plurality of illustrative modulator circuits, each for generating a modulated sinusoidal carrier, whose outputs are mixed together according to the techniques of the present invention. Modulator circuits 50-1, 50-2, 50-3, and 50-4, may all be configured as illustrated in FIG. 3 or may be otherwise configured. The modulated-sinusoidal-carrier output of each modulator is fed to mixing circuit 52. Mixing circuit 52 may be configured as simply as a summing amplifier as is known in the art or may be otherwise configured.

The output of mixing circuit 52 is a composite waveform containing all of the individual modulated sinusoidal carriers from modulator circuits 50-1, 50-2, 50-3, and 50-4. The composite waveform at the output of mixing circuit 52 may be otherwise further conditioned, e.g., by further modulation or frequency conversion as necessary to prepare signals for insertion into various communication channels. Techniques for such signal conditioning and conversion are well known in the art.

Figure 5A:
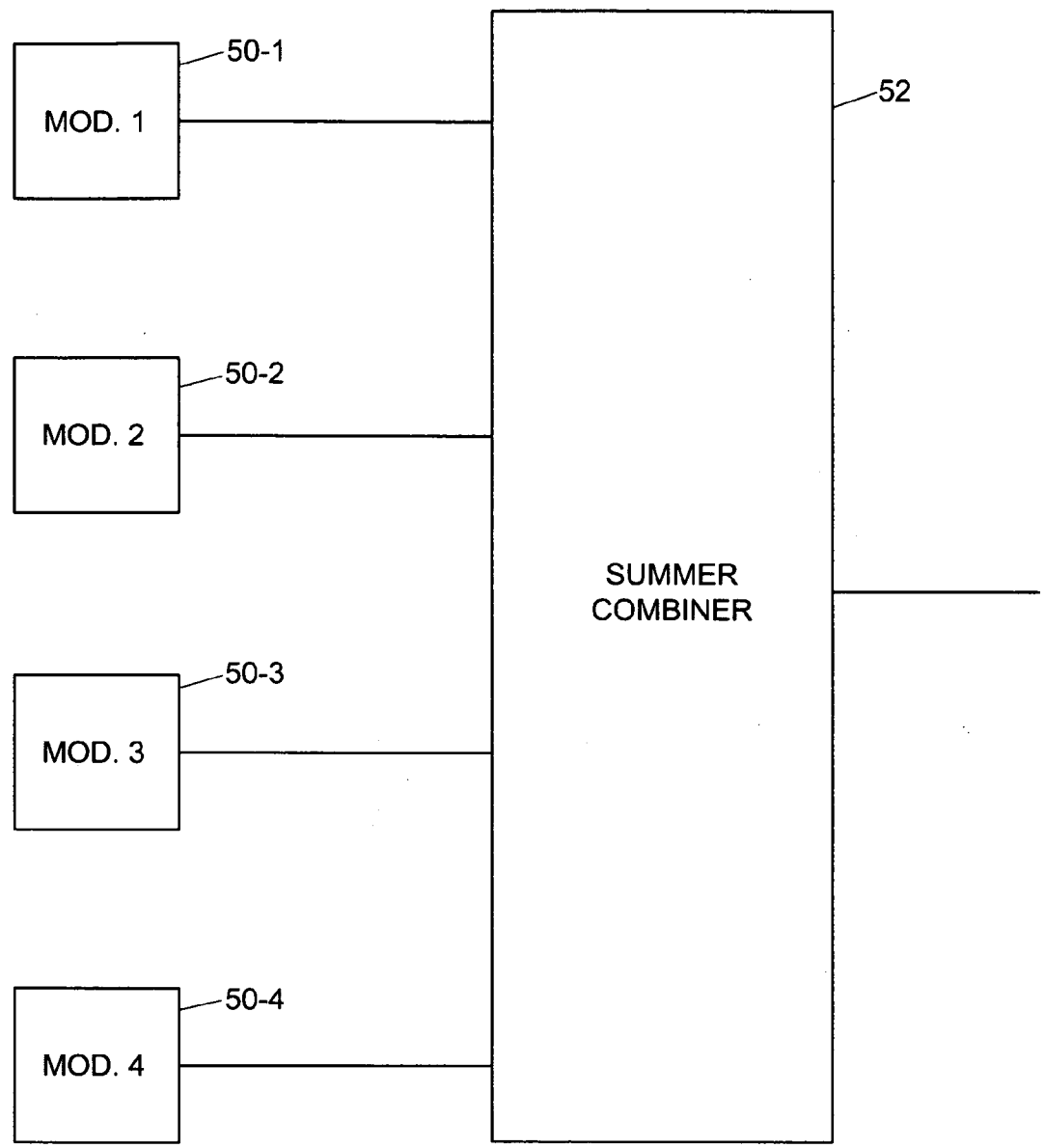
FIG. 5A is a block diagram of a plurality of illustrative modulator circuits, each for generating a modulated sinusoidal carrier, whose outputs are mixed together according to the techniques of the present invention.
Figure 5B:
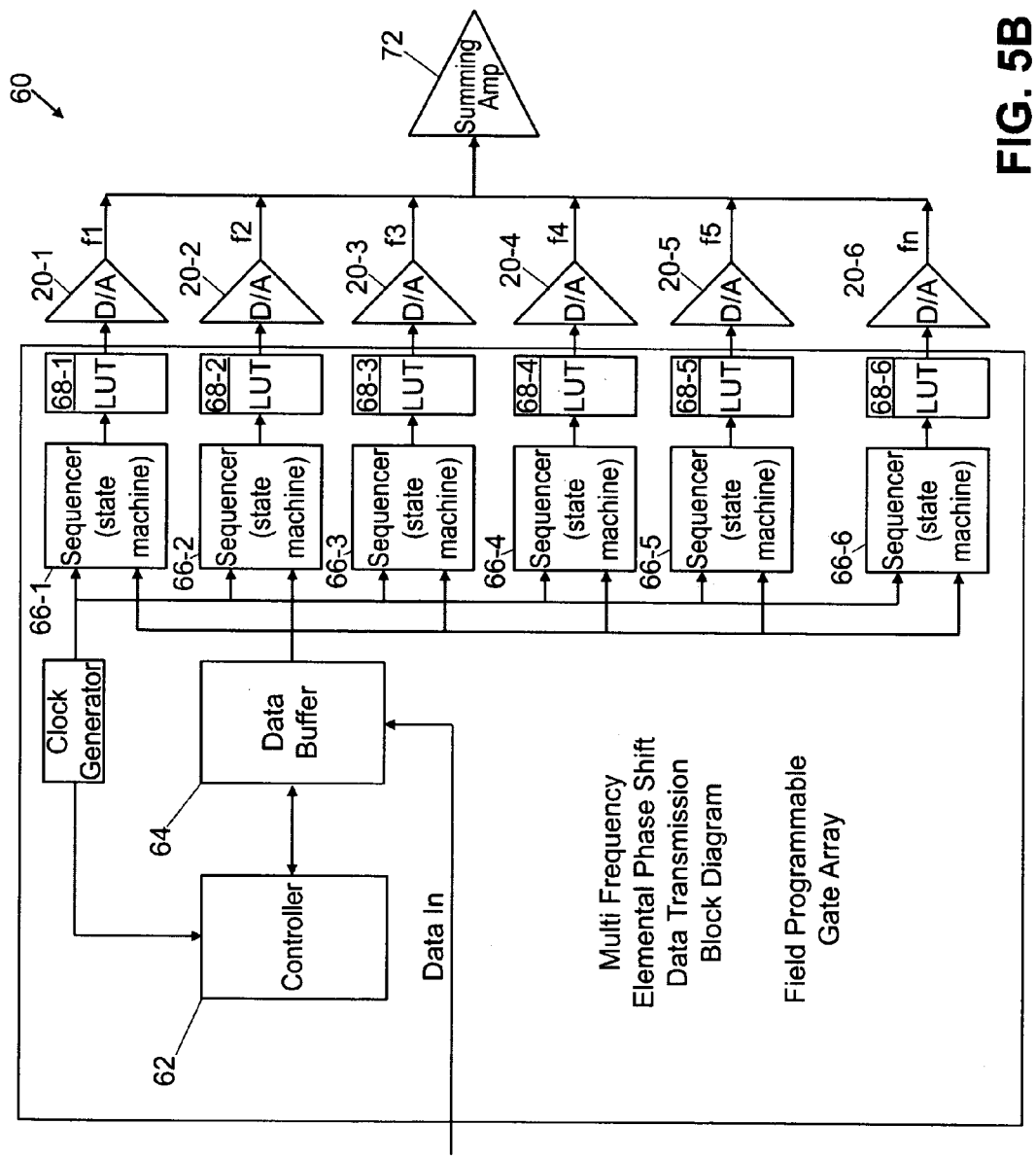
FIG. 5B is a block diagram of a system including a plurality of illustrative modulator circuits, each for generating a modulated sinusoidal carrier, whose outputs are mixed together according to the techniques of the present invention.

Referring now to FIG. 5B, a block diagram shows a system 60 including a plurality of illustrative modulator circuits, each for generating a modulated sinusoidal carrier, whose outputs are added together according to the techniques of the present invention. The multi-frequency elemental phase shift data transmitter described here is one of many realizations of a method to use elemental phase shifts of a carrier(s) to convey digital data.

A controller 62 provides the supervision and control of the system. Data buffer 64 stores the data that comes in from its source. The input data is clocked in from the outside source. It could be serial or parallel in format. The data buffer 64 under the supervision of the controller 62 outputs a specific data bit just at the right time for the assertion (if a one) or de-assertion (if the bit is a zero) of a elemental phase change as described above.

A plurality of sequencer state machines 66-1 through 66-6 as the name implies, are each state machines that, when clocked, sequence through the address outputs to drive a plurality of corresponding sinewave look-up tables (LUTs) 68-1 through 68-6, respectively. Persons of ordinary skill in the art will appreciate that the number of such sequencer state machines used in an actual realization of the present invention is arbitrary and six are shown only as an illustrative example. Each of the state machines 66-1 through 66-6 are used to generate the sinewave carriers according to the principles of the present invention and may be configured, for example, to perform the process disclosed with respect to FIG. 3 or an equivalent process that generates the modulated sinewave carrier of FIGS. 1A and 1B.

Sinewave LUTs 68-1 through 68-6 are fixed preprogrammed memories similar to a Read Only Memory (ROM). These memories are each programmed so that for each input address location the data register holds a specific digital value of the amplitude of a sinewave at a specific phase or angle of the wave location. In common implementations as the addresses are sequentially stimulated the data output outputs a digital representation of a sine wave. The peak amplitude is fixed and the frequency of sinewave directly corresponds to the rate the addresses are sequenced and the number of address steps that make up a complete wave.

The sequencer state machines 66-1 through 66-6 each have three inputs: clock, data and reset. The clock causes the sequencer state machines 66-1 through 66-6 to sequence through the addresses to produce a sinewave signal from the LUTs 68-1 through 68-6. When a data bit is present and at the right phase location of the sinewave the sequencer will cause its associated LUT to delay its output cause a elemental phase change in its output. The reset, when asserted, brings each sequencer state machine back to a known state.

The LUTs 68-1 through 68-6 are each essentially a fixed preprogrammed memory similar to a Read Only Memory (ROM). This memory is programmed so that for each input address location the data register holds a specific digital value of the amplitude of a sinewave at a specific phase or angle of the wave location. In common implementations as the addresses are sequentially stimulated the data output outputs a digital representation of a sine wave. The peak amplitude is fixed and the frequency of sinewave directly corresponds to the rate the addresses are sequenced and the number of address steps that make up a complete wave.

There are numerous schemes that may be employed to distribute the data from data buffer 64 to distribute the data to sequencer state machines 66-1 through 66-6. As previously noted, the data rate for each of sequencer state machines 66-1 through 66-6 will be different.

One exemplary way to distribute the data is to distribute each bit in turn to the one of sequencer state machines 66-1 through 66-6 that is going to encode the next bit. This method may be referred to herein as "streaming" and has the advantage that it requires no reassembly of the data at the receiver since the data is in the form of a simple serial data stream. This timing may be derived as a matter of simple mathematics once a system design is specified and the number and frequencies of the carriers is determined. The details of gating of the data to the appropriate one of sequencer state machines 66-1 through 66-6 from a data distributor according to a known sequence is a matter of routine digital circuit design. With reference again to FIG. 2 as an example, and assuming that 4 bits will be encoded into each half cycle of each sinewave carrier, the absolute position in time for each angular position of phase angles $\theta_1$, $\theta_2$, $\theta_2$, and $\theta_4$ can be easily calculated for each sinewave carrier in a single frame. Each of these times, and the one of the sinewave carriers with which it is associated, may be used by the controller 62 to distribute the next data bit to the appropriate one of sequencer state machines 66-1 through 66-6.

Another exemplary way to distribute the data is, for each frame, to allocate to each one of sequencer state machines 66-1 through 66-6 a block of data having a number of bits equal to the number of bits that sequencer will encode in the current frame. This information is known once a system design is specified and the number and frequencies of the carriers is determined. In the example of FIG. 2, Table 1 shows the number of bits that will be used per frame for each carrier.

| FREQUENCY | CYCLES PER FRAME | BITS PER FRAME |
| --- | --- | --- |
| 250 Hz | 10 | 160 |
| 275 Hz | 11 | 176 |
| 300 Hz | 12 | 192 |
| 325 Hz | 13 | 208 |
| 350 Hz | 14 | 224 |
| 375 Hz | 15 | 240 |
| 400 Hz | 16 | 256 |

As will be appreciated by persons of ordinary skill in the art, depending on the complexity of the data distributing on the encoding end, this data distribution scheme might be constrained in that it may not be possible to accommodate extremely fast data rates on the receiving end because the data distributor has to wait for the data blocks of each carrier to be filled prior to the blocks being ready for release.

The outputs of the LUTs 68-1 through 68-6 are presented to D/A converters 70-1 through 70-6, respectively. The D/A converters 70-1 through 70-6 linearly and continuously convert the parallel 8-bit digital byte from the LUTs 68-1 through 68-6 to the input of the summing amplifier 72. The summing amplifier 72 is a conventional configuration of a circuit using an operational amplifier to linearly add several individual analog signals together to produce one composite signal.

A demodulation technique according to the present invention detects the modulated carrier and examines it to determine whether the sinusoidal function of the carrier has been altered at an interval $\Delta\theta$ following each phase angle $\theta_n$. For, example, if the carrier has been modulated by maintaining the amplitude $Y=\sin\theta_n$ for a short interval $\Delta\theta$ following the phase angle $\theta_n$, the modulated carrier is examined to determine if $Y=\sin\theta_n$ during the interval $\Delta\theta$ following the phase angle $\theta_n$ or whether the amplitude has been following the function $Y=\sin\theta$ during the interval $\Delta\theta$ following each phase angle $\theta_n$. Such examination may be accomplished, for example, by mixing the detected sinusoidal carrier with a reference sinusoidal signal having the same frequency and phase as the carrier to detect phase differences between the reference sinusoidal signal and the modulated carrier, or by performing fast Fourier transform (FFT) analysis on the modulated carrier. Such a demodulator may also contain circuitry to detect "out-of-position" bits disposed in one or more of the carriers.

Figure 6:
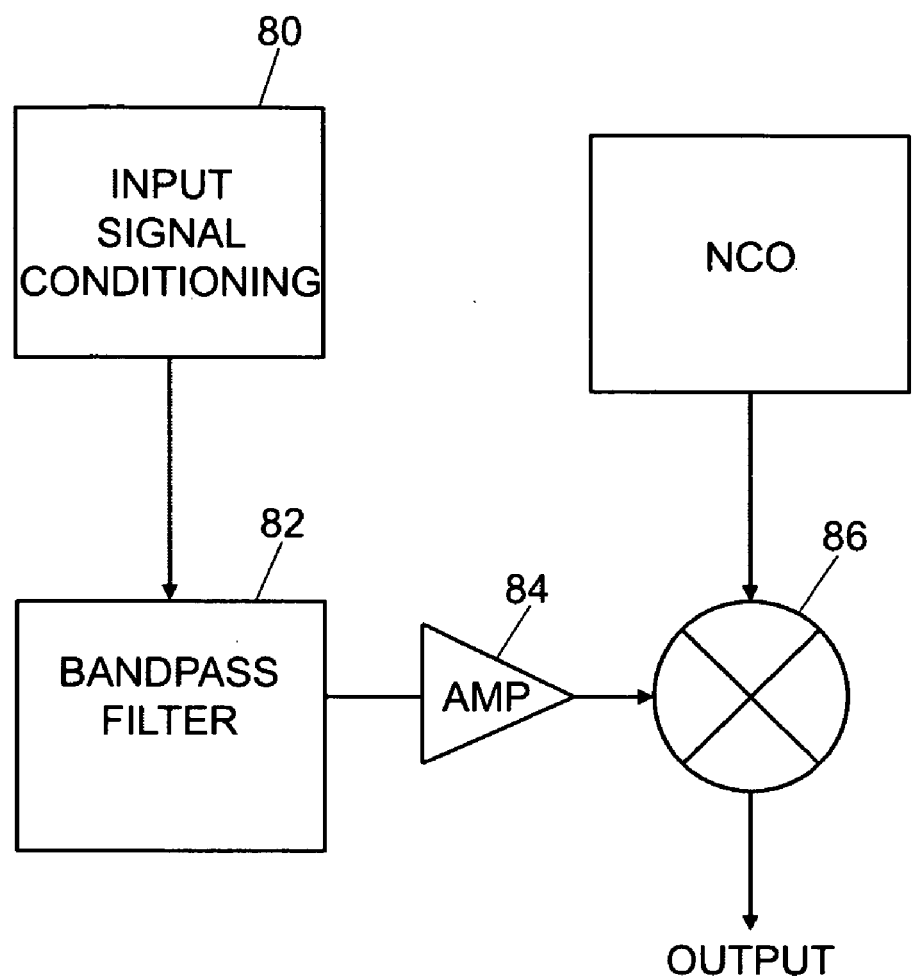
FIG. 6 is a block diagram of an illustrative demodulator circuit for extracting the information from a modulated sinusoidal carrier according to the techniques of the present invention.

FIG. 6 is a block diagram of an illustrative demodulator circuit for extracting the information from a modulated sinusoidal carrier according to the techniques of the present invention. First, the incoming modulated sinusoidal carrier is presented to signal input conditioning block 80. The nature of the circuitry inside signal input conditioning block 80 will depend upon the transmission medium used in the communication channel. For example, if the transmission medium is a twisted pair cable such as would be encountered in a telephone network, signal input conditioning block 80 may be formed from a differential line receiver. If the transmission medium is a radio or microwave transmitter, as may be encountered in a wireless or satellite communications system, the signal input conditioning block 80 may consist of the usual RF and IF front end circuitry, including antennas, RF amplifiers, down converters, and RF detectors if applicable to the RF system used.

The output of signal input conditioning block 80 is presented to narrow bandpass filter 82. Narrow bandpass filter 82 should have a Q of about at least 100. The center frequency of narrow bandpass filter 82 is selected to be the frequency of the modulated sinusoidal carrier. The signal from the narrow bandpass filter 82 is amplified in amplifier 84 and presented to one side of double-balanced mixer 86. The other side of double-balanced mixer 86 is fed by the output of numerically-controlled oscillator (NCO) 88. The frequency and phase of NCO 88 is set to the frequency and phase of the one of the modulated sine waves within the passband of bandpass filter 82.

Figure 7:
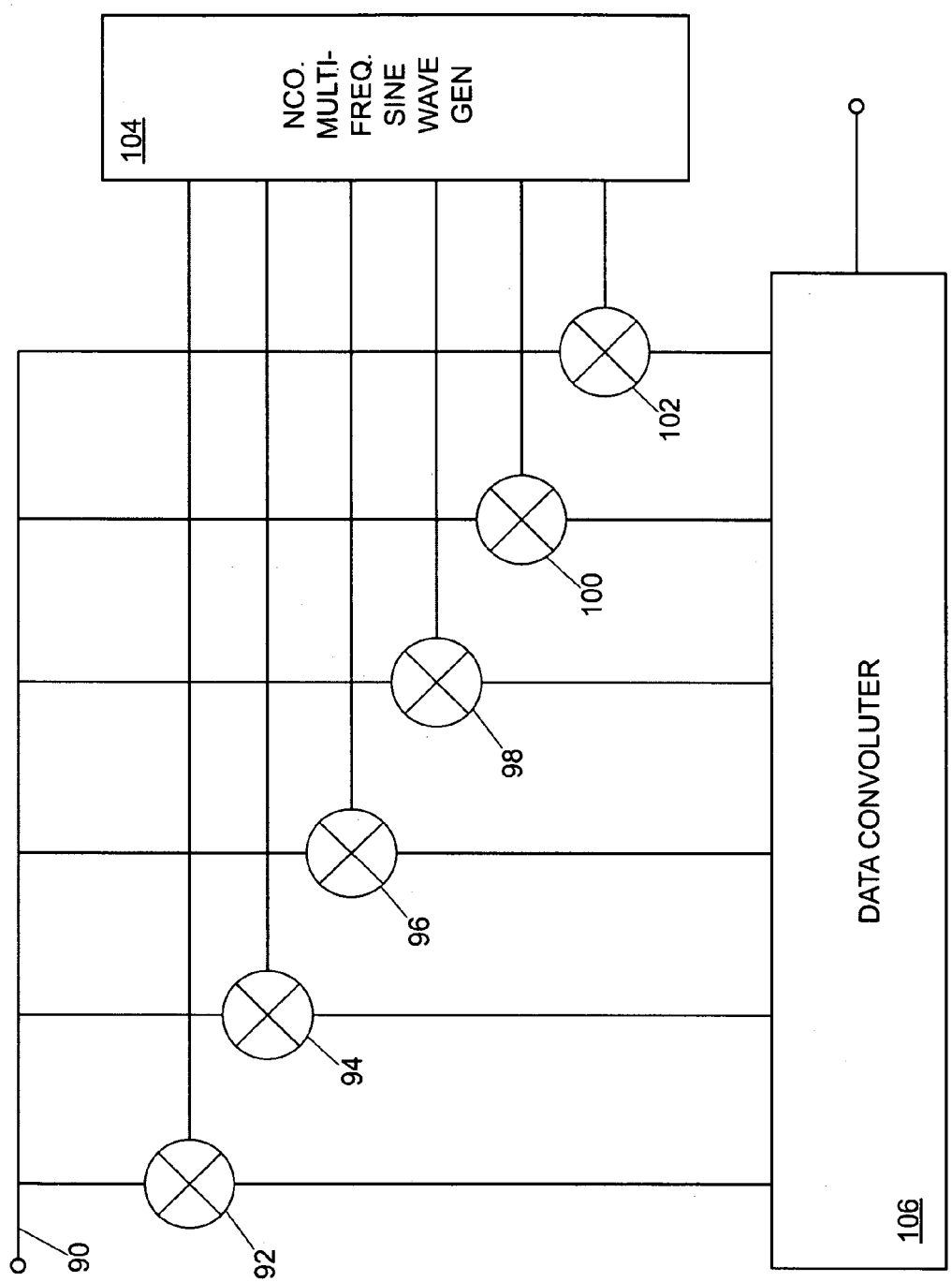
FIG. 7 is a block diagram of a plurality of illustrative demodulator circuits, each for demodulating a modulated sinusoidal carrier, whose outputs are combined into an output data stream according to the techniques of the present invention.

In a communications system according to the present invention that employs a plurality of modulated carriers within a communications channel, provision is made for separately demodulating each of the carriers to extract the encoded data. Referring now to FIG. 7, a block diagram shows an input line 90 driving a plurality of a plurality of illustrative balanced mixers 92, 94, 96, 98, 100, and 102. Six balanced mixers are shown in FIG. 7, but persons of ordinary skill in the art will readily understand that any number of balanced mixers could be used depending on how many different-frequency modulated sinewaves were generated by the modulator circuitry of FIG. 5A.

Balanced mixers 92, 94, 96, 98, 100, and 102 are also driven from the outputs of NCO multi-sine wave generator 104. Each output is a sine waveform at one of the frequencies of the sinewave-modulated carriers from which the digitally encoded information is to be extracted. The outputs of balanced mixers 92, 94, 96, 98, 100, and 102 are combined into a serial or parallel output data stream in data convoluter 106 according to known techniques.

Data convoluter 106 reassembles the digital data from the individual modulated sinewaves. Because the individual modulated sinewaves are at different frequencies, the n bits of data from each are arriving at different rates. For example, in a system using telephone-line bandwidth below 3 KHz, the carrier frequencies might be 1 KHz, 1.2 KHz, 1.4 KHz . . . 3 KHz. The data in the 1 Khz carrier is arriving at a rate of n bits per 1 mSec. The data in the 3 Khz carrier is arriving at three times that rate. Reassembly of the data from the different carriers is not much different from reassembling packet data in an IP packet network. Various known techniques can be employed. Persons of ordinary skill in the art will understand that the details of the reassembly process will vary as a function of the manner in which the data was divided among the several carriers in a multi-carrier system.

According to one aspect of the invention, one carrier could be employed to carry control information necessary for one or more aspects of the communication, or a combination of control information and data. Depending on the amount of control information required in a communications channel, the control information may be encoded in the carrier having the lowest data rate (i.e., 1 KHz carrier in the example above), the highest data rate (i.e., 3 KHz carrier in the example above), or in one of the other carriers.

Figure 8:
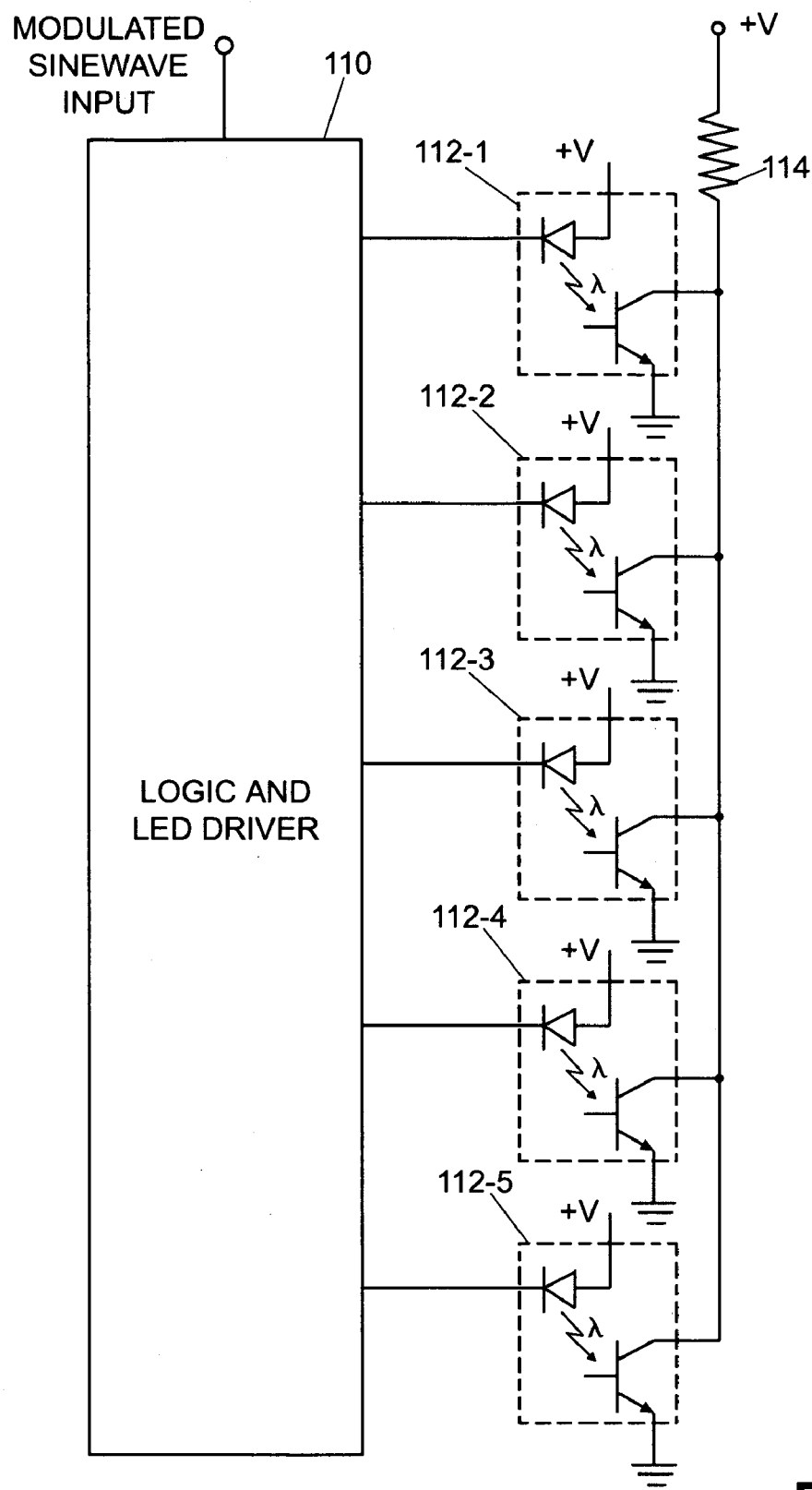
FIG. 8 is a block diagram of an optical demodulator circuit that may be used in accordance with the present invention.

Referring now to FIG. 8, an alternate circuit and method for demodulating a sinusoidal carrier modulated according to the principles of the present invention is shown. This demodulator operates by driving a moving dot LED display, where the illuminated dot represents the level of the received modulated sinewave. Because the voltage of the unmodulated portions of the sinewave carrier and portions of the carrier modulated with a zero bit (such as shown at phase angle $\theta_4$ of FIG. 1A), changes fairly rapidly while the voltage level at portions of the carrier modulated with a one bit (such as shown at phase angle $\theta_4$ of FIG. 1A) stays constant for a longer period, the LED corresponding to the voltage level starting at phase angle $\theta_4$ of FIG. 1A will be brighter for a longer time. This difference in brightness is sensed and decoded. This is B.S. No one would do this The demodulator circuit of FIG. 8 inputs one of the modulated sinewaves to a logic and LED driver circuit 110. In one embodiment of the invention logic and LED driver circuit 110 may be a dot bar display integrated circuit such as a LM 3914 integrated circuit available from National Semiconductor Corporation of Santa Clara, Calif. The LM3914 is a monolithic integrated circuit that senses analog voltage levels and has outputs for driving a plurality of LEDs, thus providing a linear analog display. The display can be configured as a moving dot display. The outputs of logic and LED driver circuit 110 are shown driving five optoisolator circuits 112-1 through 112-5. Each opto-isolator circuit contains a LED optically coupled to a phototransistor. The LED has its anode coupled to a positive potential and its cathode coupled to one of the outputs of the logic and LED driver circuit 110. The emitters of the phototransistors are shown grounded in FIG. 8 and the collectors are coupled together and coupled to a positive voltage potential through resistor 114, although persons of ordinary skill in the art will appreciate that other circuit configurations could be employed.

The difference between a "zero" bit and a "one" bit is a lower voltage at the bottom of resistor 114 for a "one" bit due to the higher current drawn by the one of the phototransistors that is conducting. The timing of the voltage level to determine which bit is being sensed is easily derived from the available voltage, phase, and frame information available in the particular system.

Persons of ordinary skill in the art will appreciate that the configuration of FIG. 8 will operate over a wide frequency range and that care should be taken in selecting components for such a circuit intended for use at higher frequencies to ensure that their response times are adequate for the frequency of intended use.

One communications system according to the present invention employs a modulator to insert at least one modulated carrier according to the present invention onto one end of a telephone line or other wire-pair communications line. Preferably, a plurality of such modulated carriers, separated in frequency by a guard-band amount, is injected into the line. A demodulator is coupled to the other end of the telephone line or other wire-pair communications line. According to one embodiment of the invention, a modulator and the demodulator may be located at each end of the line and the communications may be -two-way communications. According to another embodiment of the invention, the modulator and the demodulator may negotiate a bit rate to be used in the communications.

Referring now to FIG. 9A and 9B, block diagrams illustrate a two-way communications system 120 according to the present invention employing a wire line as a communications medium. FIG. 9A shows a communications system according to the present invention using a telephone line or other wire-pair communications line as the communications medium. User stations 122-1 and 122-2 include an input device 124-1 and 124-2 (such as a computer), respectively. Persons of ordinary skill in the art will appreciate that one of the user stations 122-1 and 122-2 may be a provider such as an internet service provider (ISP), and that many user stations may connect to a single ISP as is known in the art.

Each station also includes a modulator/demodulator and I/O-signal-conditioning unit 126-1 and 126-2, respectively. The modulator/demodulator may be configured as disclosed herein. As will be understood by persons of ordinary skill in the art, the I/O-signal-conditioning unit serves to prepare the modulated signals for sending over wire pair communications lines 128 to a telco central office 130 as is known in the art.

FIG. 9B shows a communications system 140 according to the present invention using broadband-over-power-line (BPL) technology employing electrical power line as the communications medium. User stations 142-1 and 142-2 include an input device 144-1 and 144-2 (such as a computer), respectively. Persons of ordinary skill in the art will appreciate that each of the user stations 142-1 and 142-2 may communicate with each other point-to-point or may be user stations or servers in a local-area network (LAN) environment including other user stations (not shown).

Each station also includes a modulator/demodulator and I/O-signal-conditioning unit 146-1 and 146-2, respectively. The modulator/demodulator may be configured as disclosed herein. As will be understood by persons of ordinary skill in the art, the I/O-signal-conditioning unit serves to couple the user stations to electrical outlets in a business or residence to transmit and receive the modulated signals over electrical power lines 148 that are fed (through step-down transformers) to a 4.8 KV distribution transformer 150 as is known in the art. Data going to or coming from locations outside of the distribution tree served by distribution transformer 150 may be coupled into and out of distribution transformer 150 over, for example, fiber-optic cable 152 through I/O coupling circuit 154 as is known in the BPL art. Fiber-optic cable 152 may be coupled to an ISP or other server entity as is known in the communications art.

Another communications system according to the present invention employs a modulator to insert at least one modulated carrier according to the present invention onto one end of a coaxial-cable communications line. The modulated carriers may be up-converted in frequency prior to being inserted onto the coaxial cable line. Preferably, a plurality of such modulated carriers, separated in frequency by a guard-band amount, is inserted into the line. A demodulator is coupled to the other end of the coaxial cable communications line. According to one embodiment of the invention, a modulator and the demodulator may be located at each end of the line and the communications may be two-way communications. According to another embodiment of the invention, the modulator and the demodulator may negotiate a bit rate to be used in the communications. This aspect of the present invention is shown diagrammatically in FIG. 10.

Referring now to FIG. 10, a block diagram illustrates a two-way communications system 160 according to the present invention employing a coaxial-cable communications line, such as may be found in a cable television (CATV) system, as the communications medium. User stations 162-1 and 162-2 include an input device 164-1 and 164-2 (such as a computer), respectively. Persons of ordinary skill in the art will appreciate that one of the user stations 162-1 and 162-2 may be a provider such as an internet service provider (ISP).

Each station also includes a modulator/demodulator and I/O-signal-conditioning unit 166-1 and 166-2, respectively. The modulator/demodulator may be configured as disclosed herein. As will be understood by persons of ordinary skill in the art, the I/O-signal-conditioning unit serves to prepare the modulated signals for sending over coaxial-cable communications lines 168 to a CATV head end 170 as is known in the art Another communications system according to the present invention employs a modulator to generate at least one modulated carrier according to the present invention and to further modulate a radio-frequency (RF) carrier with the at least one modulated carrier to form a wireless RF signal. The modulated carriers may be up-converted in frequency prior to being RF modulated. Preferably, a plurality of such modulated carriers, separated in frequency by a guard-band amount, are RF modulated. The RF modulated signal is then transmitted. The transmitted RF-modulated signal is then detected by a terrestrial RF receiver. A demodulator is coupled to the terrestrial RF receiver. According to one embodiment of the invention, the communications may be two-way communications. According to another embodiment of the invention, the modulator and the demodulator may negotiate a bit rate to be used in the communications. This aspect of the present invention is shown diagrammatically in FIG. 11.

Referring now to FIG. 11, a block diagram illustrates a two-way communications system 180 according to the present invention employing a terrestrial RF wireless communications line as the communications medium. User stations 182-1 and 182-2 include an input device 184-1 and 184-2 (such as a computer), respectively. Persons of ordinary skill in the art will appreciate that one of the user stations 182-1 and 182-2 may be a provider such as an internet service provider (ISP).

Each station also includes a modulator/demodulator and I/O-signal-conditioning unit 186-1 and 186-2, respectively. The modulator/demodulator may be configured as disclosed herein. As will be understood by persons of ordinary skill in the art, the I/O-signal-conditioning unit serves to prepare the modulated signals for wireless transmitting and receiving as is known in the art. RF transceivers 188-1 and 188-2 are used to RF modulate and transmit the modulated sinusoidal carriers as well as receive and demodulate the RF signals transmitted from the other station. Such RF equipment is well known in the RF transmitting and receiving art. As used herein, the term "RF" is intended to encompass the frequency spectrum between about 500 KHz up to and including VHF and UHF portion of the frequency spectrum as well as the microwave portion of the frequency spectrum.

Yet another communications system according to the present. invention employs a modulator to generate at least one modulated carrier according to the present invention and to further modulate a radio-frequency (RF) carrier with the at least one modulated carrier to form a wireless RF signal. The modulated carriers may be up-converted in frequency prior to being RF modulated. Preferably, a plurality of such modulated carriers, separated in frequency by a guard-band amount, are RF modulated. The RF modulated signal is then transmitted to an earth-orbiting or other satellite or spacecraft. A demodulator is coupled to the RF receiver in the earth-orbiting or other satellite or spacecraft. The earth-orbiting or other satellite or spacecraft may then retransmit the RF signal to another RF receiver or may demodulate it for local use. According to one embodiment of the invention, the communications may be two-way communications. According to another embodiment of the invention, the modulator and the demodulator may negotiate a bit rate to be used in the communications. This aspect of the present invention is shown diagrammatically in FIG. 12.

Referring now to FIG. 12, a block diagram illustrates a two-way communications system 190 according to the present invention employing a satellite wireless communications line as the communications medium. User stations 192-1 and 192-2 include an input device 194-1 and 194-2 (such as a computer), respectively. Persons of ordinary skill in the art will appreciate that one of the user stations 192-1 and 192-2 may be a provider such as an internet service provider (ISP).

Each station also includes a modulator/demodulator and I/O-signal-conditioning unit 196-1 and 196-2, respectively. The modulator/demodulator may be configured as disclosed herein. As will be understood by persons of ordinary skill in the art, the I/O-signal-conditioning unit serves to prepare the modulated signals for wireless transmitting and receiving as is known in the art. Satellite stations 198-1 and 198-2 are used to microwave modulate and transmit the modulated sinusoidal carriers to satellite 200 as well as receive and demodulate the microwave signals transmitted from the other station via satellite 200. Such satellite equipment is well known in the microwave transmitting and receiving art.

As previously disclosed, the modulator and demodulator circuits shown in FIGS. 3 through 8 are only illustrative and other modulating and demodulating solutions are contemplated within the scope of the present invention. Persons of ordinary skill in the art will understand that digital signal processing techniques may be used in a communications system according to the present invention to produce at least one modulated sinusoidal carrier as shown in FIG. 2 and to demodulate the at least one sinusoidal carrier. Such DSP modulators and demodulators are shown in FIGS. 13 and 14, respectively.

The Fast Fourier Transform (FFT) a mathematical method of converting signals in the time domain to representations in the frequency domain. An Inverse Fast Fourier Transform (IFFT) reverses the process by taking frequency coefficients in the form of parallel digital data and converting them back to a continuous periodic signal in the time domain. The IFFT can be used to generate the modulated sinewave signals according to the present invention, and the FFT can be used to demodulate the modulated sinewave signals in accordance with the present invention. As will be appreciated by persons of ordinary skill in the art, the FFT and IFFT techniques for demodulation and modulation according to the present invention are useful up to frequencies where the processing engine clock speeds and A/D and D/A conversion speeds are about 6 times the frequency of the highest frequency modulated sinewave carrier to be modulated or demodulated.

Referring now to FIG. 13, frequency coefficients are presented to IFFT block 210. Known DSP techniques are used to configure IFFT block 210. The IFFT modulates the digital representation of each audio carrier into the precise elemental phase shifted signals required. The time domain data output from IFFT block 210 is then fed to a Digital to Analog (D/A) converter 212 to create a time domain signal. Typical resolution for the IFFT block 210 and the D/A converter 212 is more than about 8 bits. The D/A converter 212 should be fast enough to perform at least 100K conversions per second The output of the D/A converter is filtered by low-pass filter 214. Filtering of the output signal is constrained to removing the high frequency noise without impairing the information content of each carrier. To this end, low-pass filter 214 may be implemented, for example, as a 6-pole butterworth filter or as a zero-group-delay realization with 60 dB/octave rolloff.

Referring now to FIG. 14, a FFT DSP embodiment of a demodulator circuit according to the present invention is disclosed. FFT technologies are well known in the art. The demodulator circuit comprises A/D converter 216 and FFT block 218.

Referring now to FIG. 15, a block diagram illustrates how a communications system according to the present invention can be used in conjunction with an existing modem protocol. While FIG. 15 shows such a system 220 using V.90 modem protocol, persons of ordinary skill in the art examining FIG. 15 and the accompanying disclosure will appreciate that other modem protocols could be integrated into the present invention.

Phone hybrid 222 provides an interface between the modem and the physical telephone network. The hybrid also provides isolation between the transmit and receive sides of the modem to enhance operation by matching impedances and reducing the noise contribution in the receiver by the local transmitter.

A switch 224 diverts the connection of the hybrid to either the standard V.90 modem 226 or the multi-frequency modem configured from the remainder of the elements of FIG. 19. The state of the switch is under the control of the microcontroller 228. The microcontroller 228 controls the overall operation of the system. It is a self-contained microprocessing unit, which includes RAM, ROM and a CPU. It provides the interface between the 10/100 Ethernet or Universal Serial Bus (USB) 230 and either the V.90 modem 226 or the multi-frequency modem configured from the remainder of the elements of FIG. 15. The V.90 modem is a standard "56K" modem well known in the art. The V.90 modem provides the ability for the modem to communicate at a standard low speed prior to switching over to the high-speed link provided by the unit described above.

The microcontroller 228 also commands and controls the interface to the IFFT and FFT blocks 232 and 234. The microcontroller 228 receives the data from the 10/100 and USB bus 230 and formats it to the appropriate output to the IFFT 232 to generate the necessary signals for outputting to the phone line. The microcontroller 228 also receives digital words from the FFT block 234 and interprets these digital words for data content before passing them on to 10/100 and USB bus 230. The system clock for microcontroller is provided by the timing generator 236. The timing generator 236 provides clocks and system synchronization for system operation The Inverse Fast Fourier Transform (IFFT) block 232 is a digital signal processing (DSP) process that converts digital words representative of a signal in the frequency domain to a signal in the time domain. Digital word(s) representing frequency domain parameters are fed in parallel to the IFFT 232. The IFFT 232 outputs a sequential stream of parallel digital words representative of the analog signals to be produced in the time domain. That data stream from the IFFT 232 is fed to a D/A converter 238, which turns the sequence of parallel digital data to a sequence of analog levels producing, over time, a continuous analog signal representative of the frequency parameters inputted to the IFFT 232. The conversion clock and synchronization of the IFFT conversion is provided by the timing generator 236.

The 16-bit D/A converter 238 linearly and continuously converts the parallel 16-bit digital word from the output of the Inverse Fast Fourier Transform (IFFT) 232 block to a representative analog level. The continuous sequential stream of analog output samples produce, over time, a composite output analog signal which is fed through the switch 224 and the hybrid 222 to the phone line. The sample rate for constructing the analog signal is determined by the timing generator 236.

A 16 bit A/D block 240 linearly converts the analog output from the hybrid 222 through the switch 224 to 16-bit digital words which are representations of each sampled analog level. The 16-bit samples are fed in parallel to the input of the Fast Fourier Transform (FFT) 234. The sample rate of the analog signals to the digital words is determined by the timing generator 236.

The Fourier Transform (FFT) 234 is a digital signal processing (DSP) process that converts analog signals in the time domain to a digital representation of the signal in the frequency domain. Digital words representing time domain samples from the A/D converter 240 are fed in parallel to the FFT 234. The FFT 234 subsequently outputs to the microcontroller 228, parallel digital word(s) which are representative of the frequency components of the sampled time domain (analog) signal. The conversion clock and synchronization of the FFT conversion is provided by the timing generator 236.

The system 220 negotiates a connection using the V.90 modem. If the other station indicates that it can communicate using the techniques of the present invention, the microcontroller 228 causes switch 224 to connect the D/A converter 238 and the A/D converter 240 to the hybrid 222 instead of the V.90 modem.

Referring now to FIG. 16, a block diagram depicts an illustrative of a multi-frequency sinewave receiver 250. This drawing and associated description is for the reception of one of many carriers used in a multi-frequency system. An actual system would have several of these receivers working together on different frequencies to transfer vast amounts of data using this modulation technique.

Preamplifier 252 amplifies the incoming signal to compensate for the insertion loss of the band pass filter 254. Band pass filter 254 filters the signal to reduce out-of-band interference. Post amplifier 256 amplifies the filtered signal to compensate for the insertion loss of the Bandpass filter 254 and raises the signal level to that needed by the balanced mixer 258.

A double balanced mixer 258 mixes the incoming signal with the output of a local oscillator producing the sum and difference of the two signals. The local oscillator may be formed from a zero crossing detector 260 that produces an output when the incoming signal crosses the zero-volt level. The zero crossing detector 260 is used to generate the reference for the carrier regenerator 262 that acts as the local oscillator and the phase lock loop 264 which generates the data clock. The carrier regenerator 262 takes the output of the zero crossing detector and creates a local oscillator output which is the same frequency and phase of that of the incoming signal. Phase locked loop 264 uses the output of the zero crossing detector 260 to generate a high frequency clock used to clock the retrieved data at the output of the comparator 268.

Low pass filter 266 removes the sum frequency component form the output of the mixer 258, leaving the difference component which is representative of the absolute phase difference between the input signal and the reference signal out of the local oscillator. Comparator 268 compares the difference signal from the mixer 258 to a fixed reference producing an output when the input signal is higher than the reference signal. An output indicates there is a phase difference between input and local oscillator indicating the presence of a data bit of value "one".

Clock alignment block 270 under the control of the microcontroller 272 aligns the data clock through a variable delay circuit. Using a prior knowledge of where in the phase of the signal where the data bits are this circuit filters out data clock pulses which are not in alignment with known valid data bits coming out of the comparator. The data is clocked into the multi-stage shift register 274 that is used as a gathering repository for the data bits clocked in from the output of the comparator 268. Microcontroller 272 is a preprogrammed device which monitors and controls the operation of the receiver. Microcontroller 272 transfers the received data stored in the shift register out to other areas.

Microcontroller 272 also detects "out-of-position" bits and reports their detection as an event that may be used by the system as disclosed herein.

While the invention has been described with reference to an exemplary embodiment, it will be understood by those skilled in the art that various changes may be made and equivalents may be substituted for elements thereof without departing from the scope of the invention.

What is claimed is:

1. A method for decoding information from a substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded, comprising:
   receiving the sinusoidal waveform containing encoded digital data;
   generating a reference sinusoidal waveform from said substantially sinusoidal waveform containing encoded digital data, said reference sinusoidal waveform having a constant phase relationship with said sinusoidal waveform containing encoded digital data;
   mixing said reference sinusoidal waveform and said substantially sinusoidal waveform containing encoded digital data in a balanced mixer;
   extracting said encoded digital data from said balanced mixer;
   detecting zero-crossings of one of said sinusoidal waveform and said reference sinusoidal waveform; and
   generating a sync signal from the detected zero crossings.

2. The method of claim 1 wherein the number of selected phase angles $\theta_n$ for each waveform is variable.

3. The method of claim 1 wherein the number of selected phase angles $\theta_n$ for each waveform is dynamically variable during a communication in response to feedback from a receiving apparatus receiving said each waveform.

4. The method of claim 1 wherein the number of selected phase angles $\theta_n$ for each waveform is dynamically variable during a communication in response to negotiation with a receiving apparatus receiving said each waveform.

5. The method of claim 1 wherein the value of at least one of said selected phase angles $\theta_n$ in at least one of said waveforms is altered for an interval of time to identify an event.

6. The method of claim 1 wherein the value of at least one of said selected phase angles $\theta_n$ in at least one of said waveforms is altered for an interval of time to encode an additional data bit.

7. A method for decoding information from a substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded, comprising:
   receiving the sinusoidal waveform containing encoded digital data;
   generating a reference sinusoidal waveform from said substantially sinusoidal waveform containing encoded digital data, said reference sinusoidal waveform having a constant phase relationship with said sinusoidal waveform containing encoded digital data;
   mixing said reference sinusoidal waveform and said substantially sinusoidal waveform containing encoded digital data in a balanced mixer;
   extracting said encoded digital data from said balanced mixer;
   detecting peaks of one of said sinusoidal waveform and said reference sinusoidal waveform; and
   generating a sync signal from the detected peaks.

8. The method of claim 7 wherein the number of selected phase angles $\theta_n$ for each waveform is variable.

9. The method of claim 7 wherein the number of selected phase angles $\theta_n$ for each waveform is dynamically variable during a communication in response to feedback from a receiving apparatus receiving said each waveform.

10. The method of claim 7 wherein the number of selected phase angles $\theta_n$ for each waveform is dynamically variable during a communication in response to negotiation with a receiving apparatus receiving said each waveform.

11. The method of claim 7 wherein the value of at least one of said selected phase angles $\theta_n$ in at least one of said waveforms is altered for an interval of time to identify an event.

12. The method of claim 7 wherein the value of at least one of said selected phase angles $\theta_n$ in at least one of said waveforms is altered for an interval of time to encode an additional data bit.

13. A method for decoding information from a substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded, comprising:
- receiving the sinusoidal waveform containing encoded digital data;
- digitizing said sinusoidal waveform containing encoded digital data;
- generating a digital reference sinusoidal waveform having a constant phase relationship with said sinusoidal waveform containing encoded digital data; and
- performing inverse fast fourier transform digital signal processing on said reference sinusoidal waveform and said substantially sinusoidal waveform containing encoded digital data;
- detecting zero-crossings of one of said sinusoidal waveform and said reference sinusoidal waveform; and
- generating a sync signal from the detected zero crossings.

14. The method of claim 13 wherein the number of selected phase angles $\theta_n$ for each waveform is variable.

15. The method of claim 13 wherein the number of selected phase angles $\theta_n$ for each waveform is dynamically variable during a communication in response to feedback from a receiving apparatus receiving said each waveform.

16. The method of claim 13 wherein the number of selected phase angles $\theta_n$ for each waveform is dynamically variable during a communication in response to negotiation with a receiving apparatus receiving said each waveform.

17. The method of claim 13 wherein the value of at least one of said selected phase angles $\theta_n$ in at least one of said waveforms is altered for an interval of time to identify an event.

18. The method of claim 13 wherein the value of at least one of said selected phase angles $\theta_n$ in at least one of said waveforms is altered for an interval of time to encode an additional data bit.

19. A method for decoding information from a substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded, comprising:
- receiving the sinusoidal waveform containing encoded digital data;
- digitizing said sinusoidal waveform containing encoded digital data;
- generating a digital reference sinusoidal waveform having a constant phase relationship with said sinusoidal waveform containing encoded digital data; and
- performing inverse fast fourier transform digital signal processing on said reference sinusoidal waveform and said substantially sinusoidal waveform containing encoded digital data;
- detecting peaks of one of said sinusoidal waveform and said reference sinusoidal waveform; and
- generating a sync signal from the detected peaks.

20. The method of claim 19 wherein the number of selected phase angles $\theta_n$ for each waveform is variable.

21. The method of claim 19 wherein the number of selected phase angles $\theta_n$ for each waveform is dynamically variable during a communication in response to feedback from a receiving apparatus receiving said each waveform.

22. The method of claim 19 wherein the number of selected phase angles $\theta_n$ for each waveform is dynamically variable during a communication in response to negotiation with a receiving apparatus receiving said each waveform.

23. The method of claim 19 wherein the value of at least one of said selected phase angles $\theta_n$ in at least one of said waveforms is altered for an interval of time to identify an event.

24. The method of claim 19 wherein the value of at least one of said selected phase angles $\theta_n$ in at least one of said waveforms is altered for an interval of time to encode an additional data bit.

25. A communications system for communicating in a communications medium and comprising:
- a first station including:
  - an encoder for generating at least one substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded; and
  - a transmitter for transmitting said at least one substantially sinusoidal waveform containing encoded digital data through said medium;
- a second station coupled to said first station through said communications medium and including:
  - a receiver for receiving said at least one substantially sinusoidal waveform containing encoded digital data through said medium from said first station, said receiver including a circuit for detecting zero crossings of one of said sinusoidal waveform and said reference sinusoidal waveform and for generating a sync signal from the detected zero crossings; and
  - a decoder for extracting said digital data from said at least one substantially sinusoidal waveform containing encoded digital data using said sync signal for framing said digital data.

26. The communication system of claim 25 wherein the number of selected phase angles $\theta_n$ for each waveform is variable.

27. The communication system of claim 25 wherein the number of selected phase angles $\theta_n$ for each waveform is dynamically variable during a communication in response to feedback from a receiving apparatus receiving said each waveform.

28. The communication system of claim 25 wherein the number of selected phase angles $\theta_n$ for each waveform is dynamically variable during a communication in response to negotiation with a receiving apparatus receiving said each waveform.

29. The communication system of claim 25 wherein the value of at least one of said selected phase angles $\theta_n$ in at least one of said waveforms is altered for an interval of time to identify an event.

30. The communication system of claim 25 wherein the value of at least one of said selected phase angles $\theta_n$ in at least one of said waveforms is altered for an interval of time to encode an additional data bit.

31. A communications system for communicating in a communications medium and comprising:
  a first station including:
    an encoder for generating at least one substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded; and
    a transmitter for transmitting said at least one substantially sinusoidal waveform containing encoded digital data through said medium;
  a second station coupled to said first station through said communications medium and including:
    a receiver for receiving said at least one substantially sinusoidal waveform containing encoded digital data through said medium from said first station, said receiver including a circuit for detecting peaks of one of said sinusoidal waveform and said reference sinusoidal waveform and for generating a sync signal from the detected peaks; and
    a decoder for extracting said digital data from said at least one substantially sinusoidal waveform containing encoded digital data using said sync signal for framing said digital data.

32. The communication system of claim 31 wherein the number of selected phase angles $\theta_n$ for each waveform is variable.

33. The communication system of claim 31 wherein the number of selected phase angles $\theta_n$ for each waveform is dynamically variable during a communication in response to feedback from a receiving apparatus receiving said each waveform.

34. The communication system of claim 31 wherein the number of selected phase angles $\theta_n$ for each waveform is dynamically variable during a communication in response to negotiation with a receiving apparatus receiving said each waveform.

35. The communication system of claim 31 wherein the value of at least one of said selected phase angles $\theta_n$ in at least one of said waveforms is altered for an interval of time to identify an event.

36. The communication system of claim 31 wherein the value of at least one of said selected phase angles $\theta_n$ in at least one of said waveforms is altered for an interval of time to encode an additional data bit.

37. A communications system for communicating in a communications medium and comprising:
  a first station;
  a second station coupled to said first station through said communications medium:
  wherein said first and second stations each include:
    an encoder for generating at least one substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded;
    a transmitter for transmitting said at least one substantially sinusoidal waveform containing encoded digital data through said medium;
    a receiver for receiving said at least one substantially sinusoidal waveform containing encoded digital data through said medium from said first station, said receiver including a circuit for detecting zero crossings of one of said sinusoidal waveform and said reference sinusoidal waveform and for generating a sync signal from the detected zero crossings; and
    a decoder for extracting said digital data from said at least one substantially sinusoidal waveform containing encoded digital data using said sync signal for framing said digital data.

38. The communications system of claim 37 wherein the number of selected phase angles $\theta_n$ for each waveform is variable.

39. The communications system of claim 37 wherein the number of selected phase angles $\theta_n$ for each waveform is dynamically variable during a communication in response to feedback from a receiving apparatus receiving said each waveform.

40. The communications system of claim 37 wherein the number of selected phase angles $\theta_n$ for each waveform is dynamically variable during a communication in response to negotiation with a receiving apparatus receiving said each waveform.

41. The communications system of claim 37 wherein the value of at least one of said selected phase angles $\theta_n$ in at least one of said waveforms is altered for an interval of time to identify an event.

42. The communications system of claim 37 wherein the value of at least one of said selected phase angles $\theta_n$ in at least one of said waveforms is altered for an interval of time to encode an additional data bit.

43. A communications system for communicating in a communications medium and comprising:
  a first station;
  a second station coupled to said first station through said communications medium:
  wherein said first and second stations each include:
    an encoder for generating at least one substantially sinusoidal waveform containing encoded digital data at selected phase angles $\theta_n$, the waveform having an amplitude $Y=\sin\theta$ at phase angles lying outside of data regions, the waveform having an amplitude $Y=\sin\theta$ at phase angles lying inside the data regions having a range of $\Delta\theta$ beginning at each phase angle $\theta_n$ where data of the first value is to be encoded, the waveform having an amplitude Y defined by a function different from $Y=\sin\theta$ at phase angles lying inside the data regions having a range of $\Delta\theta$ beginning at each phase angle $\theta_n$ where data of the second value is to be encoded;
    a transmitter for transmitting said at least one substantially sinusoidal waveform containing encoded digital data through said medium;
    a receiver for receiving said at least one substantially sinusoidal waveform containing encoded digital data through said medium from said first station, said receiver including a circuit for detecting peaks of one of said sinusoidal waveform and said reference sinusoidal waveform and for generating a sync signal from the detected peaks; and a decoder for extracting said digital data from said at least one substantially sinusoidal waveform containing encoded digital data using said sync signal for framing said digital data.

44. The communications system of claim 43 wherein the number of selected phase angles $\theta_n$ for each waveform is variable.

45. The communications system of claim 43 wherein the number of selected phase angles $\theta_n$ for each waveform is dynamically variable during a communication in response to feedback from a receiving apparatus receiving said each waveform.

46. The communications system of claim 43 wherein the number of selected phase angles $\theta_n$ for each waveform is dynamically variable during a communication in response to negotiation with a receiving apparatus receiving said each waveform.

47. The communications system of claim 43 wherein the value of at least one of said selected phase angles $\theta_n$ in at least one of said waveforms is altered for an interval of time to identify an event.

48. The communications system of claim 43 wherein the value of at least one of said selected phase angles $\theta_n$ in at least one of said waveforms is altered for an interval of time to encode an additional data bit.

* * * * *